United States Patent
Seo et al.

(10) Patent No.: US 10,111,346 B2
(45) Date of Patent: Oct. 23, 2018

(54) DISPLAY DEVICE

(71) Applicant: Samsung Display Co., Ltd., Yongin-si, Gyeonggi-do (KR)

(72) Inventors: Tae An Seo, Hwaseong-si (KR); Jung Hun Lee, Hwaseong-si (KR); Jin Hwan Choi, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/656,491

(22) Filed: Jul. 21, 2017

(65) Prior Publication Data

US 2018/0077808 A1    Mar. 15, 2018

(30) Foreign Application Priority Data

Sep. 12, 2016   (KR) .................. 10-2016-0117429

(51) Int. Cl.
| | |
|---|---|
| *G09G 3/00* | (2006.01) |
| *H05K 5/00* | (2006.01) |
| *G06F 3/044* | (2006.01) |
| *H05K 5/02* | (2006.01) |
| *H05K 1/14* | (2006.01) |
| *H05K 1/18* | (2006.01) |

(52) U.S. Cl.
CPC .......... *H05K 5/0017* (2013.01); *G06F 3/044* (2013.01); *H05K 1/144* (2013.01); *H05K 1/189* (2013.01); *H05K 5/0217* (2013.01); *H05K 2201/051* (2013.01); *H05K 2201/058* (2013.01); *H05K 2201/10151* (2013.01)

(58) Field of Classification Search
CPC .................................................. G09G 2380/02
See application file for complete search history.

(56) References Cited

U.S. PATENT DOCUMENTS

| | | | |
|---|---|---|---|
| 8,711,566 B2 | 4/2014 | O'Brien | |
| 2003/0160735 A1* | 8/2003 | Lee ................. | G06F 3/147 345/4 |
| 2011/0176260 A1* | 7/2011 | Walters ............. | G06F 1/1641 361/679.01 |
| 2013/0058063 A1 | 3/2013 | O'Brien | |
| 2015/0009636 A1* | 1/2015 | Jeong ............... | B65H 18/10 361/749 |
| 2015/0220188 A1* | 8/2015 | Zhao ................ | G09G 3/36 345/174 |

FOREIGN PATENT DOCUMENTS

| | | |
|---|---|---|
| KR | 10-2014-0059274 A | 5/2014 |
| KR | 10-2015-0037196 A | 4/2015 |
| KR | 10-2015-0099668 A | 9/2015 |

* cited by examiner

*Primary Examiner* — Sanghyuk Park
(74) *Attorney, Agent, or Firm* — Innovation Counsel LLP

(57) ABSTRACT

A display device may include a support plate, a first display unit, a second display unit, a third display unit, a pad, and a circuit board. The first display unit overlaps the support plate. The second display unit is connected to the first display unit. A portion of the second display unit may move relative to the support plate. The third display unit is connected through the first display unit to the second display unit. A portion of the third display may move relative to the support plate. The pad includes a pad electrode that is electrically connected to the first display unit. The circuit board is electrically connected to the pad. A first section of the circuit board is bent relative to a second section of the circuit board and is oriented perpendicular or oblique with respect to the first display unit.

22 Claims, 19 Drawing Sheets

DISPLAY DEVICE

RELATED APPLICATION(S)

This application claims priority to and the benefit of Korean Patent Application No. 10-2016-0117429 filed in the Korean Intellectual Property Office on Sep. 12, 2016; the entire contents of the Korean Patent Application are incorporated herein by reference.

BACKGROUND

1. Field

The technical field relates to a display device, e.g., an expandable display device.

2. Description of the Related Art

A display device, e.g., an expandable display device, may include a display unit, a sliding mechanism for moving the display unit (e.g., to expand or reduce an image display area of the display device), and a driving module for controlling the display unit to display images according to input data. When the sliding mechanism operates and/or when the display unit moves, the driving module may also move. Repeated movement of the driving module may result in damage of the driving module. As a result, the performance of the display device may become unsatisfactory.

The above information disclosed in this Background section is for enhancement of understanding of the background of this application. This Background section may contain information that does not form the prior art that is already known in this country to a person of ordinary skill in the art.

SUMMARY

Embodiments may be related to a display device (e.g., an expandable display device) that may maximize a size of an image display area of the display device in an expansion mode. The display device may be expandable to opposite sides.

Embodiments may be related to a display device (e.g., an expandable display) device with minimum stress applied to a flexible display panel of the display device. An image display area of the display device may be stably expanded or reduced.

An embodiment may be related to a display device, e.g., an expandable display device, including a housing, a first roller portion, a second roller portion, a flexible display panel, and a flexible circuit board. The housing may include a support plate. The first roller portion and the second roller portion may be positioned at opposite sides of the support plate and may be respectively connected to the housing by a first sliding portion and a second sliding portion for sliding relative to the support plate. The flexible display panel may include a fixed display unit positioned (and fixed) on the support plate, a first variable display unit and a second variable display unit respectively connected to the first roller portion and the second roller portion and including variable exposure areas, and an expansion portion set (or "expansion portion" for conciseness) positioned beyond the fixed display unit, including multiple layers, and including a pad portion. The flexible circuit board may be electrically connected to the pad portion and includes at least one bent portion.

The flexible display panel may include a flexible substrate, a first passivation layer positioned below the flexible substrate, and a touch sensor portion positioned on the flexible substrate. The flexible circuit board may be connected to a printed circuit board (PCB) overlapping the fixed display unit. The expansion portion may include a first expansion portion formed at the flexible substrate and including the pad portion, a second expansion portion formed at the first passivation layer, and a third expansion portion formed at the touch sensor portion.

The expansion portion may include a first bent portion, and the flexible circuit board may include a second bent portion. A touch contact portion of the touch sensor portion may be positioned between the third expansion portion and the printed circuit board (PCB). The touch contact portion may overlap the flexible circuit board, and may include the second bent portion.

The expansion portion may be parallel to the fixed display unit, and the flexible circuit board may include a third bent portion and a fourth bent portion. A touch contact portion may be positioned between the third expansion portion and the printed circuit board (PCB). The touch contact portion may overlap the flexible circuit board, and may include the third bent portion and the fourth bent portion.

The flexible display panel may include a flexible substrate, a first elastomer layer positioned below the flexible substrate, and a second elastomer layer positioned on the flexible substrate. The flexible circuit board may be connected to a printed circuit board (PCB) overlapping the fixed display unit. The flexible display panel may include a first surface enhancing layer positioned below the first elastomer layer and a second surface enhancing layer positioned on the second elastomer layer.

The expansion portion may include multiple layers of a fourth expansion portion formed at the flexible substrate and including the pad portion, a fifth expansion portion formed at the first elastomer layer, and a sixth expansion portion formed at the second elastomer layer. The expansion portion may include a fifth bent portion, and the flexible circuit board may include a sixth bent portion. The expansion portion may be positioned parallel to the fixed display unit, and the flexible circuit board may include a seventh bent portion and an eighth bent portion.

The expandable display device may further include a rail portion configured to support the flexible display panel. The rail portion may include a fixed rail portion fixed to the support plate, a first moving rail portion connected to the first roller portion and engaged with the fixed rail portion, and a second moving rail portion connected to the second roller portion and engaged with the fixed rail portion.

The first roller portion may include a first roller housing provided with a first slit, and a first roller rotatably installed at the first roller housing. The second roller portion may include a second roller housing provided with a second slit, and a second roller rotatably installed at the second roller housing.

The first moving rail portion may be fixed to the first roller housing, and the second moving rail portion may be fixed to the second roller housing. The first moving rail portion and the second moving rail portion may overlap the support plate in a reduction mode, and may be expanded from the support plate to the outside thereof in an expansion mode.

A length of the first moving rail portion may be longer than a maximum sliding distance of the first roller portion, and a length of the second moving rail portion may be longer than a maximum sliding distance of the second roller portion.

The first sliding portion may include a first driving slider fixed to one end of the first roller housing, a first following slider fixed to another end of the first roller housing, and a first actuator connected to the first driving slider. The second sliding portion may include a second driving slider fixed to one end of the second roller housing, a second following slider fixed to another end of the second roller housing, and a second actuator connected to the second driving slider.

The first driving slider may be positioned at the outside of the second following slider with a first guiding wall formed at the housing therebetween. The second driving slider may be positioned at the outside of the first following slider with a second guiding wall formed at the housing therebetween.

The flexible display panel may include a first dummy portion positioned at the outside of the first variable display unit, and a second dummy portion positioned at the outside of the second variable display unit. In an expansion mode, the first dummy portion and the second dummy portion may respectively contact the first roller and the second roller.

A first guiding portion may be connected to the first roller housing below the support plate to receive the first variable display unit and the first dummy portion in a reduction mode, and a second guiding portion may be connected to the second roller housing below the support plate to receive the second variable display unit and the second dummy portion in a reduction mode.

An embodiment may be related to a display device. The display device may include a support plate, a first display unit, a second display unit, a third display unit, a pad, and a first circuit board. The first display unit may overlap the support plate. A first end of the second display unit may be connected through a second end of the second display unit to the first display unit and may move relative to the support plate. The third display unit may be connected through the first display unit to the second display unit. A first end of the third display may be connected through a second end of the third display unit to the first display unit and may move relative to the support plate. The pad may include a pad electrode. The pad electrode may be electrically connected to the first display unit. The first circuit board may be electrically connected to the pad and may be positioned between the second display unit and the third display unit in a plan view (e.g., a top view or a front view) of the display device.

The first circuit board may be connected to a second circuit board. The second circuit board may overlap the first display unit.

According to the embodiment, it is possible to easily adjust the size of the viewable display unit, and to stably support the flexible display panel through the rail portion in the expansion mode. According to the embodiment, since the driving module portion is fixed regardless of elements associated with the sliding operation, it is not damaged, and stress due to the bending of the expansion portion does not affect the display unit.

DETAILED DESCRIPTION

Example embodiments are described with reference to the accompanying drawings. As those skilled in the art would realize, the described embodiments may be modified in various ways.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In this application, when a first element (such as a layer, film, region, or substrate) is referred to as being "on" a second element, the first element may be directly on the second element, or one or more intervening elements may be present between the first element and the second element.

In this application, unless explicitly described to the contrary, the word "comprise" and variations such as "comprises" or "comprising" may imply the further inclusion of other elements.

In this application, the term "portion" may mean "assembly", "module", or "unit"; the term "expansion portion" may mean "extension set"; the term "display unit" may mean "image-display unit" (e.g., an LCD unit or an OLED unit); the term "connected" may mean "electrically connected" and/or "mechanically connected"; the term "fixed" may mean "fixed with respect to a housing of a display device" and may mean movable along with the display device; a "bent portion" may include a first section and a second section that are bent relative to each other.

Figure 1:
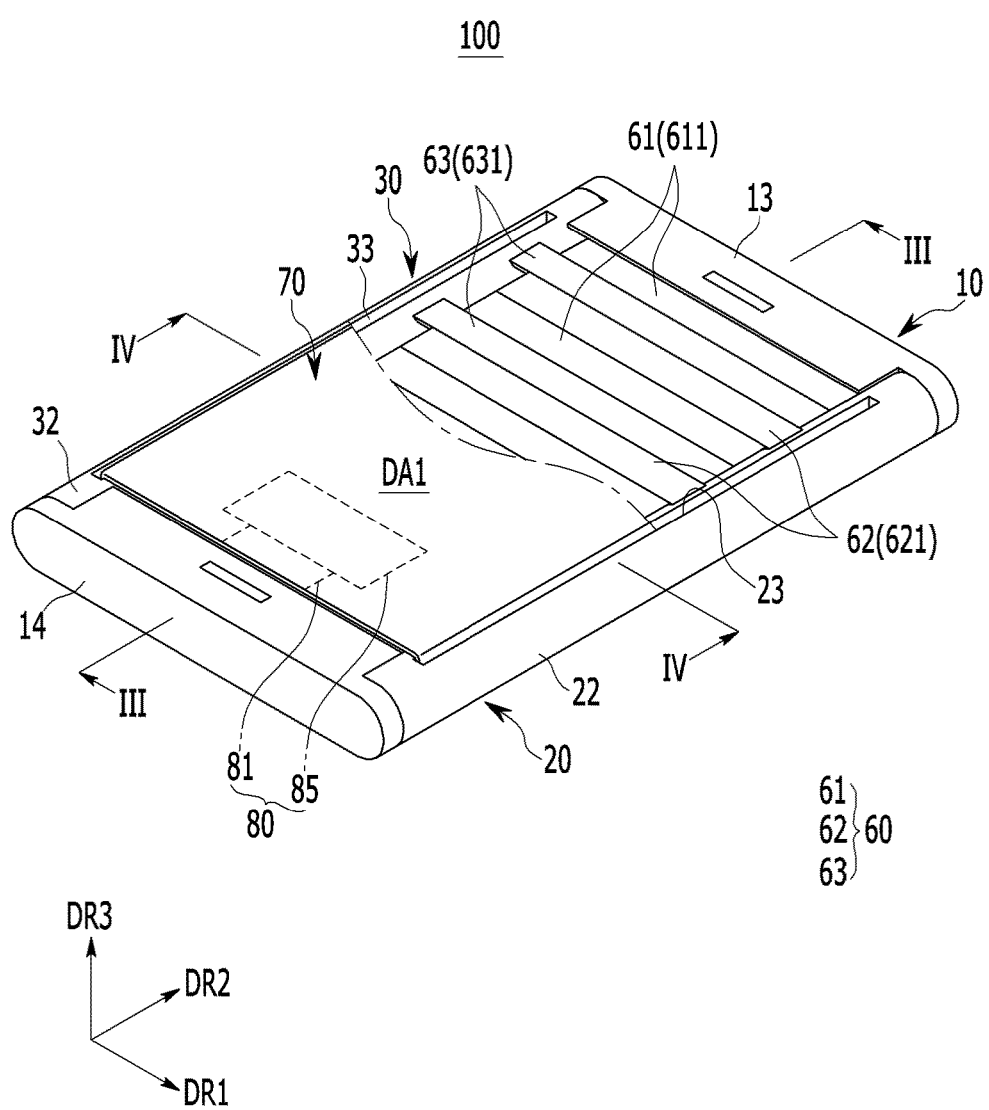
FIG. 1 illustrates a perspective view of a reduction mode of an expandable display device according to an embodiment.
Figure 2:
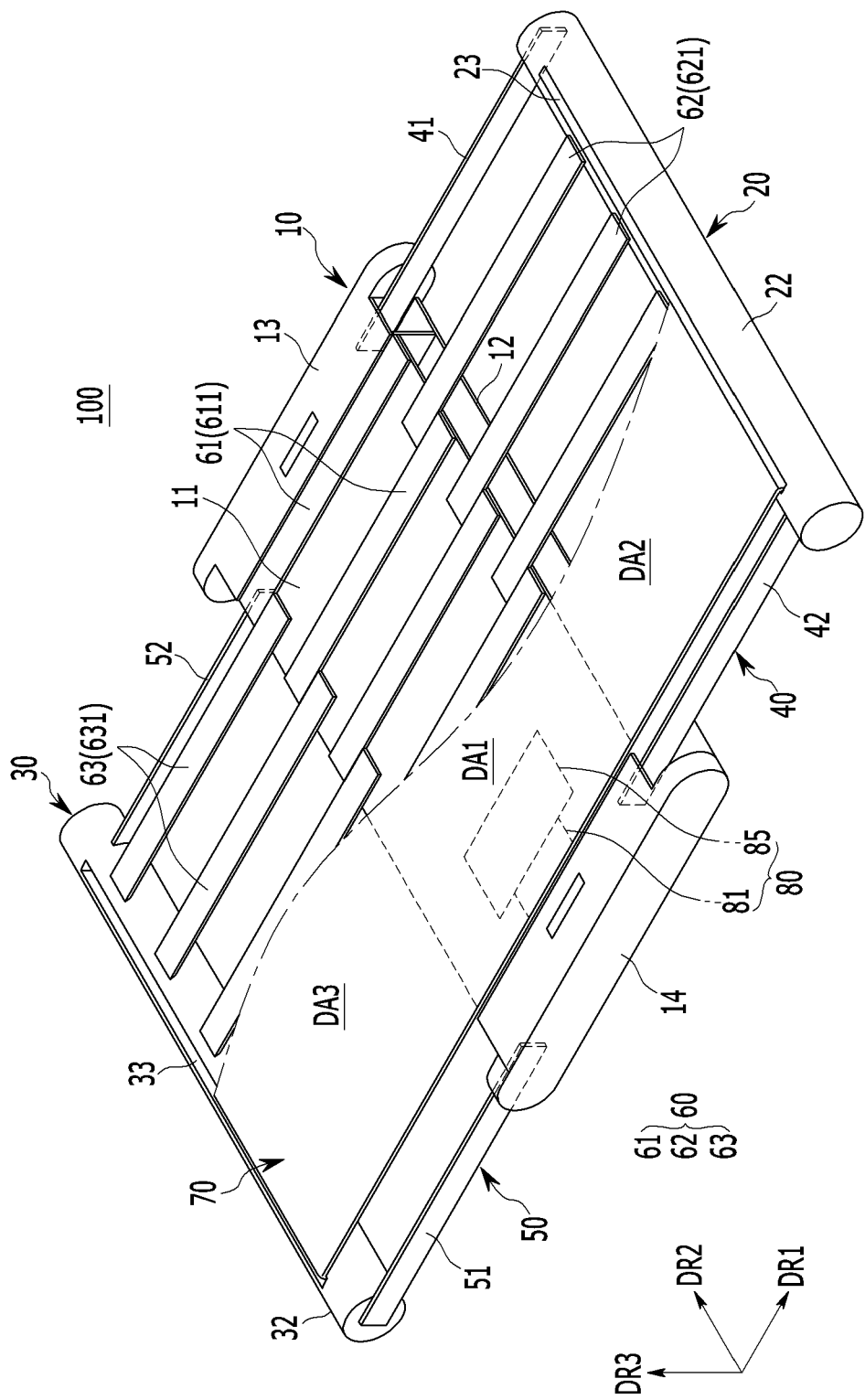
FIG. 2 illustrates a perspective view of an expansion mode of an expandable display device according to an embodiment.
Figure 3:
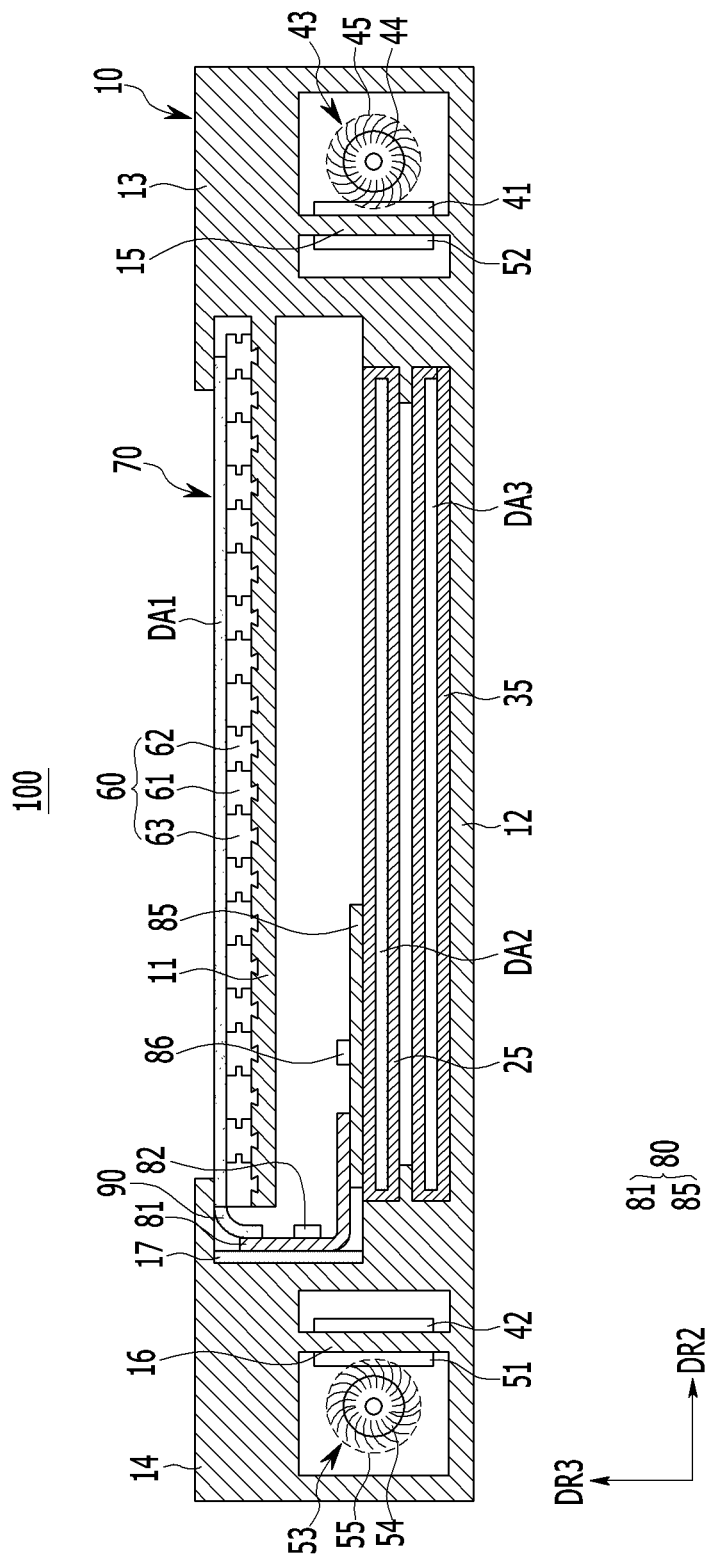
FIG. 3 illustrates a cross-sectional view taken along line III-III of FIG. 1 according to an embodiment.
Figure 4:
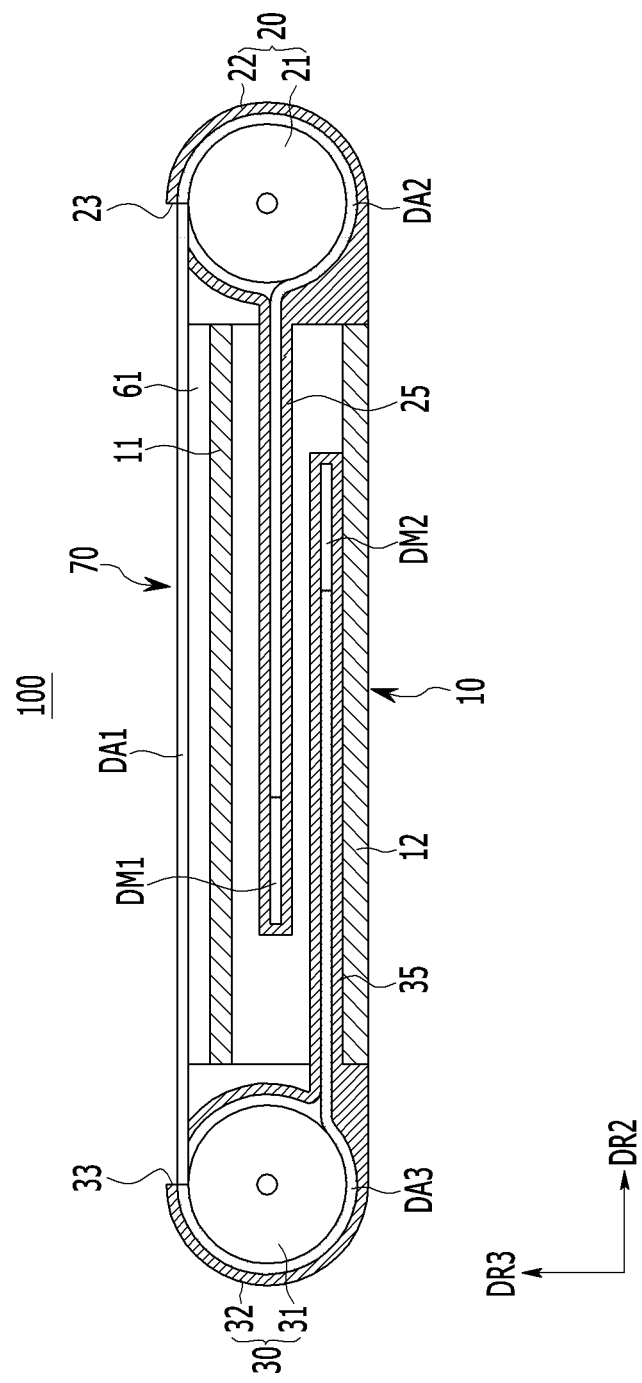
FIG. 4 illustrates a cross-sectional view taken along line IV-IV of FIG. 1 according to an embodiment.

FIG. 1 illustrates a perspective view of a reduction mode of an expandable display device according to an embodiment, and FIG. 2 illustrates a perspective view of an expansion mode of an expandable display device according to an embodiment. FIG. 3 illustrates a cross-sectional view taken along line III-III of FIG. 1 according to an embodiment, and FIG. 4 illustrates a cross-sectional view taken along line IV-IV of FIG. 1 according to an embodiment.

Referring to FIG. 1 to FIG. 4, an expandable display device 100 includes a housing 10, a first roller portion 20, a second roller portion 30, a first sliding portion 40, a second sliding portion 50, a rail portion 60, a flexible display panel 70, and a driving module portion 80.

The housing 10 may include a support plate 11 and an auxiliary support plate 12 facing each other along a third direction DR3. The housing 10 may include a first receiving portion 13 connected to one side of the support plate 11 and the auxiliary support plate 12, and a second receiving portion 14 connected to another side of the support plate 11 and the auxiliary support plate 12.

The support plate 11 may be an upper support plate, and the auxiliary support plate 12 may be a lower support plate. The first receiving portion 13 and the second receiving portion 14 face each other along a second direction DR2. The first receiving portion 13 is provided with an inner space for installing a first motor 44, and the second receiving portion 14 is provided with an inner space for installing a second motor 54.

A first direction DR1 may be a first surface direction of the expandable display device 100, and the second direction DR2 may be a second surface direction crossing the first surface direction. The third direction DR3 may be a thickness direction of the expandable display device 100. The first direction DR1 may be a horizontal direction, and the second direction DR2 may be a vertical direction.

The first roller portion 20 is positioned at one side of the support plate 11 and the auxiliary support plate 12, and the second roller portion 30 is positioned at another side of the support plate 11 and the auxiliary support plate 12. The first roller portion 20 and the second roller portion 30 face along the first direction DR1. The first roller portion 20 includes a first roller 21 and a first roller housing 22 surrounding the first roller 21. The second roller portion 30 includes a second roller 31 and a second roller housing 32 surrounding the second roller 31.

Axial directions of the first roller 21 and the second roller 31 are parallel to the second direction DR2. The first roller housing 22 and the second roller housing 32 may have a substantially cylindrical shape of which opposite ends are closed. The first roller 21 is installed to be rotatable by a bearing (not shown) in the inside of the first roller housing 22, and the second roller 31 is installed to be rotatable by a bearing (not shown) at the inside of the second roller housing 32.

The first roller housing 22 includes a first slit 23 formed to be parallel to an axial direction of the first roller 21, and the second roller housing 32 includes a second slit 33 formed to be parallel to an axial direction of the second roller 31. Some portions of the flexible display panel 70 may enter the insides of the first roller housing 22 and the second roller housing 32 through the first slit 23 and the second slit 33 to contact the first roller 21 and the second roller 31.

An adhesion layer (not shown), which has a weak adhesive material, may be positioned on surfaces of the first roller 21 and the second roller 31. The flexible display panel 70 may closely contact the first roller 21 and the second roller 31 by the adhesion layer. The first roller 21 and the second roller 31 may have the same diameter, and a distance between the support plate 11 and the auxiliary support plate 12 may substantially correspond to the diameter of the first roller 21 and the second roller 31.

The first roller portion 20 is connected to the housing 10 through the first sliding portion 40, and moves by operation of the first sliding portion 40 such that a distance between the first roller portion 20 and the support plate 11 is changed. The first sliding portion 40 may include a pair of first sliders 41 and 42 fixed to opposite ends of the first roller housing 22, and a first actuator 43 connected to a first slider of one of the pair of first sliders 41 and 42.

The second roller portion 30 is connected to the housing 10 through the second sliding portion 50, and moves by operation of the second sliding portion 50 such that a distance between the second roller portion 30 and the support plate 11 is changed. The second sliding portion 50 may include a pair of second sliders 51 and 52 fixed to opposite ends of the second roller housing 32, and a second actuator 53 connected to a second slider of one of the pair of second sliders 51 and 52.

Figure 5:
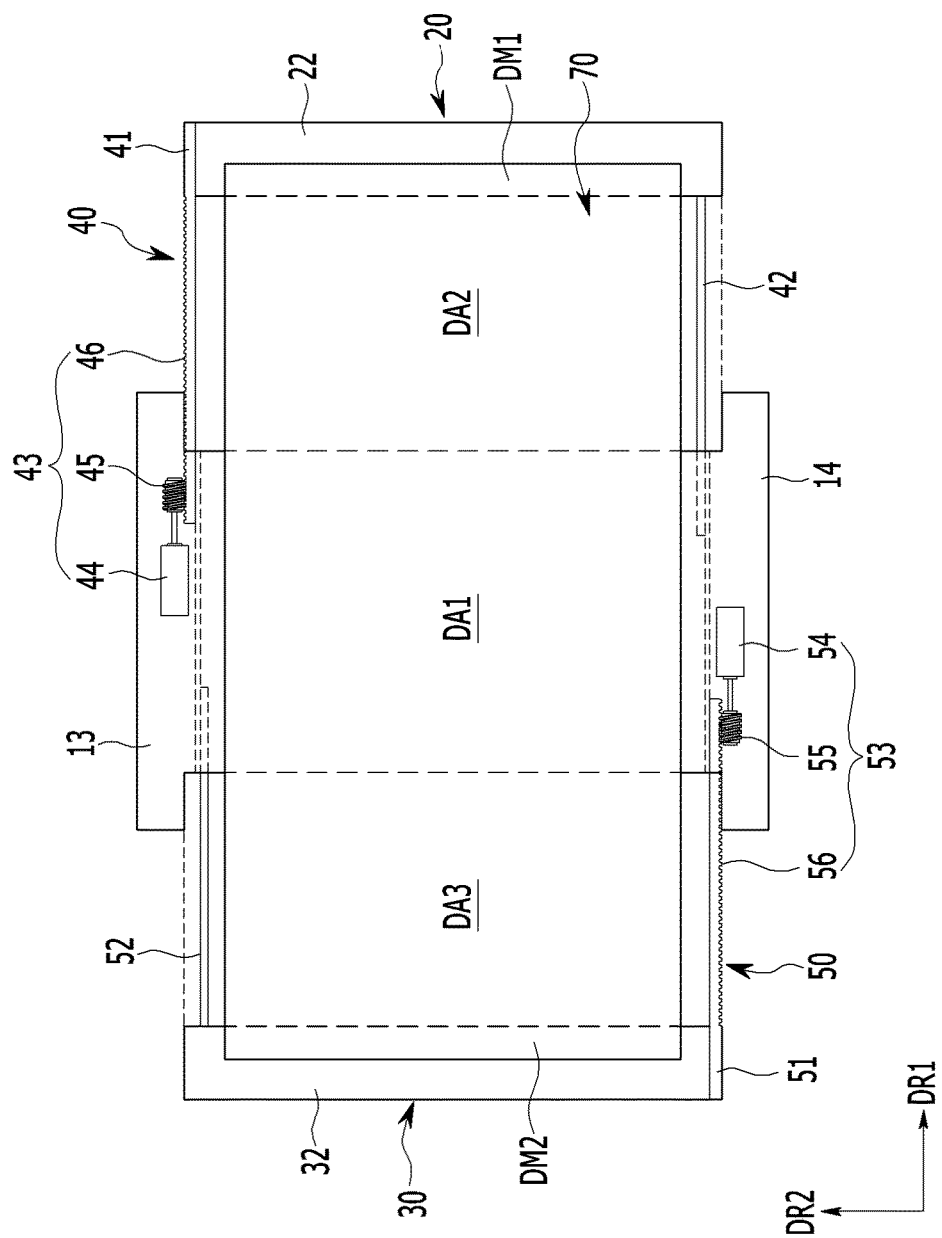
FIG. 5 illustrates a top plan view of the expandable display device shown in FIG. 2 according to an embodiment.

FIG. 5 illustrates a top plan view of the expandable display device shown in FIG. 2 according to an embodiment.

Referring to FIG. 1 to FIG. 5, the first sliders 41 and 42 and the second sliders 51 and 52 may be bar-shaped. The first sliders 41 and 42 extend in the first direction DR1 and face each other in the second direction DR2. The second sliders 51 and 52 also extend in the first direction DR1 and face each other in the second direction DR2.

The pair of first sliders 41 and 42 may include a first driving slider 41 positioned at the first receiving portion 13 and a first following slider 42 positioned at the second receiving portion 14. The pair of second sliders 51 and 52 may include a second driving slider 51 positioned at the second receiving portion 14 and a second following slider 52 positioned at the first receiving portion 13.

The first driving slider 41 may be positioned outside more than the second following slider 52 to not collide with the second following slider 52. The housing 10 may include a first guiding wall 15 positioned between the first driving slider 41 and the second following slider 52. The first driving slider 41 and the second following slider 52 may smoothly move along the first guiding wall 15.

The second driving slider 51 may be positioned at the outside of the first following slider 42 to not collide with the first following slider 42. The housing 10 may include a second guiding wall 16 between the second driving slider 51 and the first following slider 42. The second driving slider 51 and the first following slider 42 may smoothly move along the second guiding wall 16.

The pair of first sliders 41 and 42 and the pair of second sliders 51 and 52 may be positioned at the same height from the lowermost of the housing 10. Although not illustrated, the first driving slider may be positioned at an upper or lower side of the second following slider, and the second driving slider may be positioned at an upper or lower side of the first following slider.

The first actuator 43 may include the first motor 44 fixed to the first receiving portion 13, a first pinion gear 45 connected to the first motor 44, and a first rack gear 46 engaged with the first pinion gear 45 at one surface of the first driving slider 41. The second actuator 53 may include the second motor 54 fixed to the second receiving portion 14, a second pinion gear 55 connected to the second motor 54, and a second rack gear 56 engaged with the second pinion gear 55 at one surface of the second driving slider 51.

When the first pinion gear 45 is rotated the first motor 44, the first driving slider 41 moves in the first direction DR1 and moves the first roller portion 20. Depending on a rotation direction and amount of the first motor 44, a position of the first roller portion 20 is set. When the second pinion gear 55 is rotated by the second motor 54, the second driving slider 51 moves in the first direction DR1 and moves the second roller portion 30. Depending on a rotation direction and amount of the second motor 54, a position of the second roller portion 30 is set.

Although the motor as a power source and the first sliding portion 40 and the second sliding portion 50 including the rack gear and the pinion gear as power deliver mechanism have been described, the first sliding portion 40 and the second sliding portion 50 are not limited thereto. That is, except for the motor, another power source may be applied, and except for the rack gear and the pinion gear, another power deliver mechanism may be applied.

Referring back to FIG. 1 to FIG. 4, the rail portion 60 for supporting the flexible display panel 70 is installed on the support plate 11. The rail portion 60 includes a fixed rail portion 61 fixed to the support plate 11, a first moving rail portion 62 connected to the first roller portion 20 to be engaged with the fixed rail portion 61, and a second moving rail portion 63 connected to the second roller portion 30 to be engaged with the fixed rail portion 61.

The fixed rail portion 61 includes a plurality of fixed rails 611, and the first moving rail portion 62 includes a plurality of first moving rails 621. The second moving rail portion 63 includes a plurality of second moving rails 631. The plurality of fixed rails 611, the plurality of first moving rails 621, and the plurality of second moving rails 631 may respectively be formed to have a bar-shaped rail parallel to the first direction DR1, and the rail may be made of a metal material.

The plurality of fixed rails 611 are aligned on the support plate 11 to be spaced apart from each other along the second direction DR2. The plurality of first moving rails 621 are fixed to the first roller housing 22, and are aligned to be spaced apart from each other along the second direction DR2. The plurality of second moving rails 631 are fixed to the second roller housing 32, and are aligned to be spaced apart from each other along the second direction DR2.

A first moving rail 621 and a second moving rail 631 may be positioned between two fixed rails 611 adjacent along the second direction DR2. In this case, lateral surfaces of the first moving rail 621 and the second moving rail 631 are engaged with each other, and the fixed rail 611, the first moving rail 621, the second moving rail 631, and the fixed rail 611 are sequentially and repeatedly disposed along the second direction DR2.

Lateral surfaces of the plurality of fixed rails 611, the plurality of first moving rails 621, and the plurality of second moving rails 631 may be engaged with each other through a protrusion-groove combination structure. In addition, the plurality of fixed rails 611, the plurality of first moving rails 621, and the plurality of second moving rails 631 may be engaged with the support plate 11 through the protrusion-groove combination structure. The first moving rail portion 62 and the second moving rail portion 63 may be slid in the first direction DR1 with respect to the support plate 11.

Although not illustrated, the fixed rail 611, the first moving rail 621, the fixed rail 611, the second moving rail 631, and the fixed rail 611 may be sequentially and repeatedly disposed along the second direction DR2.

In a reduction mode, the first moving rail portion 62 and the second moving rail portion 63 is positioned on the support plate 11. In an expansion mode, the first moving rail portion 62 slides together with the first roller portion 20 to be expanded in a positive first direction DR1 from the support plate 11. The second moving rail portion 63 slides together with the second roller portion 30 to be expanded in a negative first direction DR1.

Each length of the plurality of first moving rails 621 may be greater than a maximum distance by which the first roller housing 22 may slide, and each length of the plurality of second moving rails 631 may be greater than a maximum distance by which the second roller housing 32 may slide. In this case, the first moving rail portion 62 and the second moving rail portion 63 do not separate from the fixed rail portion 61 in the expansion mode.

The flexible display panel 70 covers an upper surface of the rail portion 60. The flexible display panel 70 may be one of an organic light emitting panel, a liquid crystal panel, and an electrophoretic display panel, but is not limited thereto.

The flexible display panel 70 includes a fixed display unit DA1 positioned on the support plate 11 and fixed to the fixed rail portion 61, a first variable display unit DA2 that is assembled in the first roller portion 20 and of which an exposure area varies, and a second variable display unit DA3 that is assembled in the second roller portion 30 and of which an exposure area varies.

The flexible display panel 70 may include a first dummy portion DM1 connected to (and positioned at the outside of) the first variable display unit DA2, and a second dummy portion DM2 connected to (and positioned at the outside of) the second variable display unit DA3. The first variable display unit DA2 and the second variable display unit DA3 face each other along the first direction DR1 with the fixed display unit DA1 therebetween, and the first dummy portion DM1 and the second dummy portion DM2 are positioned at an outermost part of the flexible display panel 70. The first dummy portion DM1 and the second dummy portion DM2 may or may not include a circuit element and a dummy pixel.

In the reduction mode, the first variable display unit DA2 is inserted into the first roller housing 22 through the first slit 23, such that some part thereof contacts the first roller 21 and the remaining part thereof overlaps the fixed display unit DA1 below the fixed display unit DA1. The second variable display unit DA3 is inserted into the second roller housing 32 through the second slit 33, such that some part thereof contacts the second roller 31 and the remaining part thereof overlaps the fixed display unit DA1 below the fixed display unit DA1.

In the reduction mode, the fixed display unit DA1 displays an image, and the first variable display unit DA2 and the second variable display unit DA3 do not display an image.

In the expansion mode, the first variable display unit DA2 is draw out of the first roller housing 22 to be positioned parallel to the fixed display unit DA1, and the second variable display unit DA3 is draw out of the second roller housing 32 to be positioned parallel to the fixed display unit DA1. In this case, the first dummy portion DM1 contacts the first roller 21 and the second dummy portion DM2 contacts the second roller 31.

In the expansion mode, the first variable display unit DA2 and the second variable display unit DA3 display an image in addition to the fixed display unit DA1, thus enlarging a display region. In this case, the first variable display unit DA2 is supported by the first moving rail portion 62 and the second variable display unit DA3 is supported by the second moving rail portion 63, thereby stably maintaining their shapes.

Referring to FIG. 3 and FIG. 4, the first roller portion 20 includes a first guiding portion 25 that supports the first variable display unit DA2 and the first dummy portion DM1 and guides their sliding. The first guiding portion 25 is fixed to the first roller housing 22 below the support plate 11, and includes a receiving space which is opened toward the first roller 21. In the reduction mode, the first variable display unit DA2 and the first dummy portion DM1 are positioned in a receiving space of the first guiding portion 25.

The second roller portion 30 includes a second guiding portion 35 that supports the second variable display unit DA3 and the second dummy portion DM2 and guides their sliding. The second guiding portion 35 is fixed to the second roller housing 32 below the support plate 11, and includes a receiving space opened toward the second roller 31. In the reduction mode, the second variable display unit DA3 and the second dummy portion DM2 are positioned in a receiving space of the second guiding portion 35. The first guiding portion 25 and the second guiding portion 35 may overlap each other on the auxiliary support plate 12.

For convenience of illustration in FIG. 4, although it is illustrated that the flexible display panel 70, the first roller housing 22, and the second roller housing 32 contact, a space between the first and second roller housings 22 and 32 and the flexible display panel 70 is actually provided to not restrict movement of the flexible display panel 70.

Referring to FIG. 3, the driving module portion 80 is connected to the flexible display panel 70, and applies an electrical signal for displaying an image to the flexible display panel 70. The driving module portion 80 includes a flexible circuit board 81 connected to the flexible display panel 70, and a printed circuit board (PCB) 85 connected to the flexible circuit board 81. The flexible circuit board 81 may be a chip on film (COF) including a driving integrated circuit 82, and the printed circuit board 85 includes a control circuit 86.

The printed circuit board 85 may transmit image data and a timing synchronization signal to the driving integrated circuit 82 of the flexible circuit board 81. The driving integrated circuit 82 may generate a data signal and a pixel driving signal for displaying an image based on the image data and the timing synchronization signal to transmit them to the flexible display panel 70.

Figure 6:
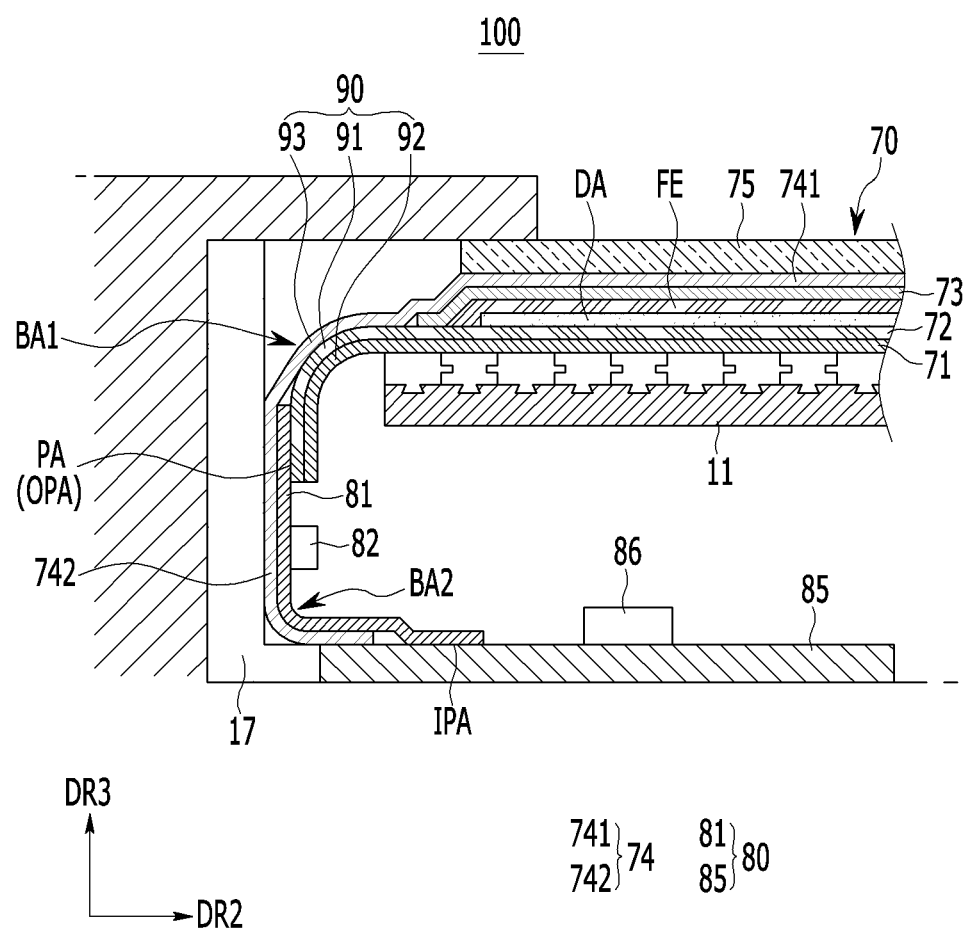
FIG. 6 illustrates a partial cross-sectional view of the expandable display device shown in FIG. 3 according to an embodiment.
Figure 7:
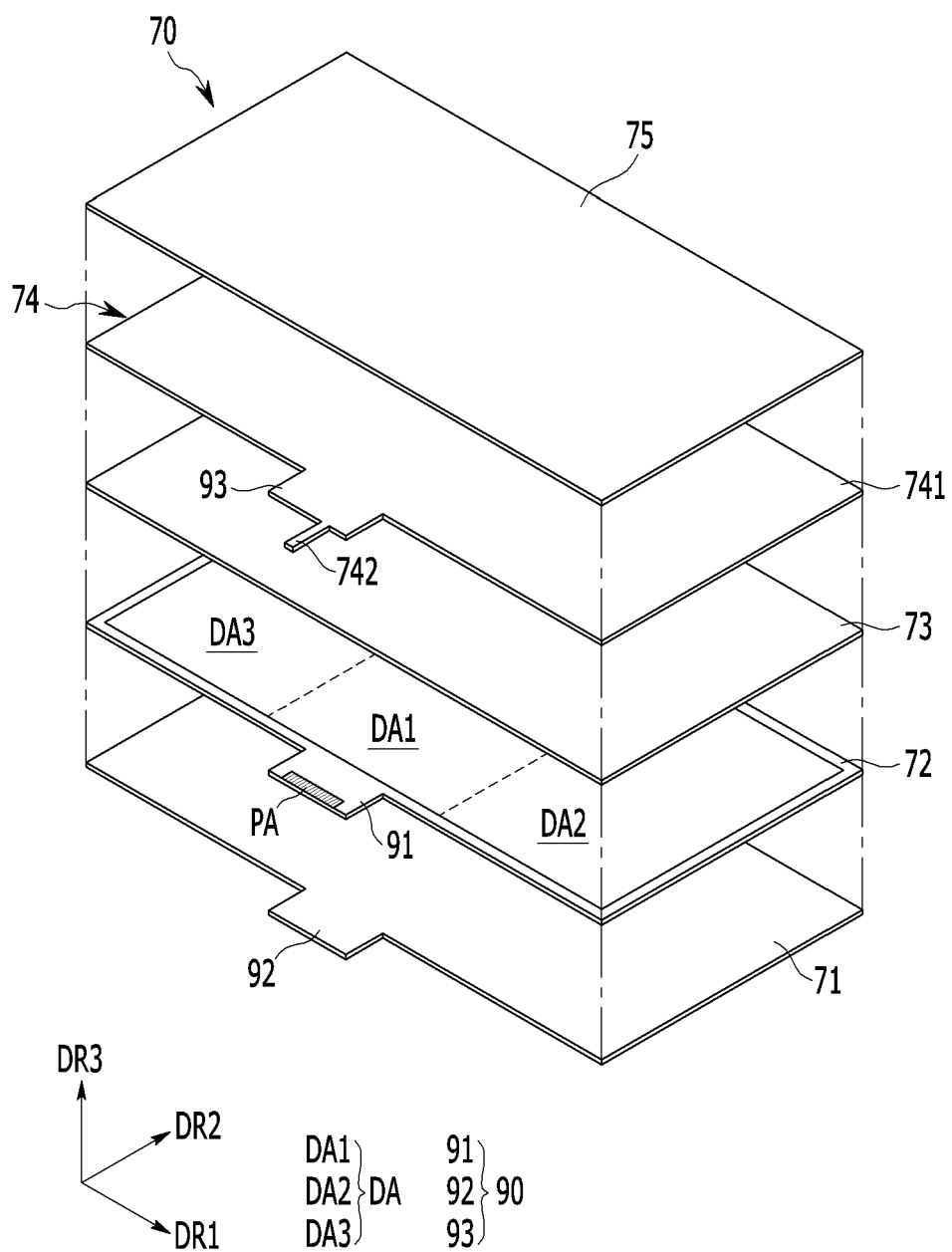
FIG. 7 illustrates an exploded perspective view of a flexible display panel of an expandable display device according to an embodiment.

FIG. 6 illustrates a partially enlarged view of the expandable display device shown in FIG. 3, and FIG. 7 illustrates an exploded perspective view of a flexible display panel of an expandable display device according to an embodiment.

Referring to FIG. 6 and FIG. 7, the flexible display panel 70 may include a first passivation layer 71, a flexible substrate 72 (or pad 72), a second passivation layer 73, a touch sensor portion 74, and a window 75. The display unit (DA) may be positioned on the flexible substrate 72, and may be sealed by a thin film encapsulation layer (FE). The display unit (DA) includes the fixed display unit DA1, the first variable display unit DA2, and the second variable display unit DA3.

The display unit (DA) includes a plurality of driving circuits (not shown) and a plurality of pixels. In a case of the organic light emitting panel, the driving circuit includes at least two thin film transistors and at least one capacitor. A pixel includes a hole injection electrode (anode), an electron injection electrode (cathode), and an organic emission layer. The thin film encapsulation layer (FE) may be an inorganic layer or may include an organic layer and an inorganic layer.

The first passivation layer 71 supports the flexible substrate 72, and the second passivation layer 73 covers and passivates the display unit and the thin film encapsulation layer (FE). The flexible substrate 72 may include a polyimide, and the first passivation layer 71 and the second passivation layer 73 may include polyethylene terephthalate.

The touch sensor portion 74 may be positioned the second passivation layer 73. The touch sensor portion 74 includes a touch sensor (not shown) that may input information when a finger of a user or a pen contacts a screen thereof. The touch sensor may operate through various methods, and a representative method thereof is a capacitive type which senses a position where a capacitance change is generated depending on the contact.

The touch sensor portion 74 may include a touch effective portion 741 overlapping the display unit (DA), and a touch contact portion 742 for connecting the touch effective portion 741 and the printed circuit board 85. A plurality of sensing electrodes (not shown) are positioned at the touch effective portion 741, and wires (not shown) for electrically connecting the plurality of sensing electrodes and the printed circuit board 85 are positioned at the touch contact portion 742.

The window 75 is positioned at an uppermost portion of the flexible display panel 70, and protects the touch sensor portion 74 and the display unit (DA) from external impact or interference. The window 75 may be formed with a flexible polymer film. A reflection preventing portion (not shown) for suppressing reflection of ambient light may be positioned between the display unit (DA) and the window 75. The reflection preventing portion may include a polarization film or a color filter.

The flexible display panel 70 includes an expansion portion 90 positioned at the outside of the fixed display unit DA1. The expansion portion 90 may include multiple layers, and includes a pad portion (PA), which may be a section of the flexible substrate 72 (or pad 72). Specifically, the expansion portion 90 may include a first expansion portion 91 formed at the flexible substrate 72, a second expansion portion 92 formed at the first passivation layer 71, and a third expansion portion 93 formed at the touch sensor portion 74.

The pad portion (PA) is positioned at an edge of the first expansion portion 91. Pad electrodes connected to signal lines (not shown) of the display unit (DA) are positioned at the pad portion (PA). The second expansion portion 92 and the third expansion portion 93 overlap each other with the first expansion portion 91 therebetween. The second expansion portion 92 supports the first expansion portion 91, and the third expansion portion 93 protects the first expansion portion 91. The touch contact portion 742 may be expanded toward the printed circuit board 85 from the third expansion portion 93.

The expansion portion 90 of the flexible display panel 70 includes a first bent portion BA1. The first bent portion BA1 may be positioned between the fixed display unit DA1 and the pad portion (PA), and may be bent at an angle of about 90°. The pad portion (PA) is positioned parallel to the third direction DR3 at a lowermost portion of the flexible substrate 72 through the first bent portion BA1.

The flexible circuit board 81 includes an output the pad portion (OPA) connected to the pad portion (PA) of the flexible display panel 70, and an input the pad portion (IPA) connected to the printed circuit board 85. The touch contact portion 742 overlaps the flexible circuit board 81 at the outside of the flexible circuit board 81, and the flexible circuit board 81 and the touch contact portion 742 include a second bent portion BA2. The second bent portion BA2 may be bent at an angle of about 90°.

With the second bent portion BA2 therebetween, some of the flexible circuit board 81 positioned at the output pad portion (OPA) is positioned parallel to the third direction DR3, and some of the flexible circuit board 81 positioned at the input pad portion (IPA) is positioned parallel to the second direction DR2. The printed circuit board 85 is positioned parallel to the second direction DR2, and overlaps the flexible display panel 70 below the flexible display panel 70.

In this case, the housing 10 may include a buffering sheet 17 for protecting the flexible circuit board 81 and the touch contact portion 742. In FIG. 6, it is illustrated that the thin film encapsulation layer (FE) is not positioned at the first bent portion BA1, but if necessary, the thin film encapsulation layer (FE) may be expanded to the first bent portion BA1.

In the expandable display device 100, the expansion portion 90 includes the first bent portion BA1 and the pad portion (PA), and the flexible circuit board 81 includes the second bent portion BA2. Accordingly, the flexible display panel 70, the flexible circuit board 81, and the printed circuit board 85 may substantially form a ⊏ shape or C shape, and the driving module portion 80 is positioned below the fixed display unit DA1, which does not move relative to the support plate 11.

If it is assumed that the pad portion is positioned at the first dummy portion such that the driving module portion is connected to the outside of the first dummy portion, the driving module portion, while the first sliding portion operates, moves together with the first dummy portion. In this case, the driving module portion may be damaged due to the repeated operation of the driving module portion, thus a complicated structural design for preventing the damage to the driving module portion is required.

However, in the expandable display device 100, since a position of the driving module portion 80 is fixed (e.g., relative to the support plate 11) regardless of the operation of the first sliding portion 40 and the second sliding portion 50, the driving module portion 80 may not be easily damaged. In addition, since the pad portion (PA) is positioned at the expansion portion 90, a width of a non-display area of the flexible substrate 72 surrounding the display unit (DA) may be minimized.

Further, in the expandable display device 100, since the first bent portion BA1 is included in the expansion portion 90, stress according to the bending is limited to the expansion portion 90. That is, the stress according to the bending does not affect the display unit (DA). Accordingly, stress at the flexible display panel 70 due to the bending is minimized.

Since the expandable display device 100 corresponds to a dual-expandable display device expanded in two directions, it is possible to easily adjust the size of the viewable display unit (DA). For example, a user may select the reduction mode in a general use environment, and when watching a movie and the like, he/she may select the expansion mode. In the expansion mode, the flexible display panel 70 is stably supported by the first moving rail portion 62 and the second moving rail portion 63.

Figure 8:
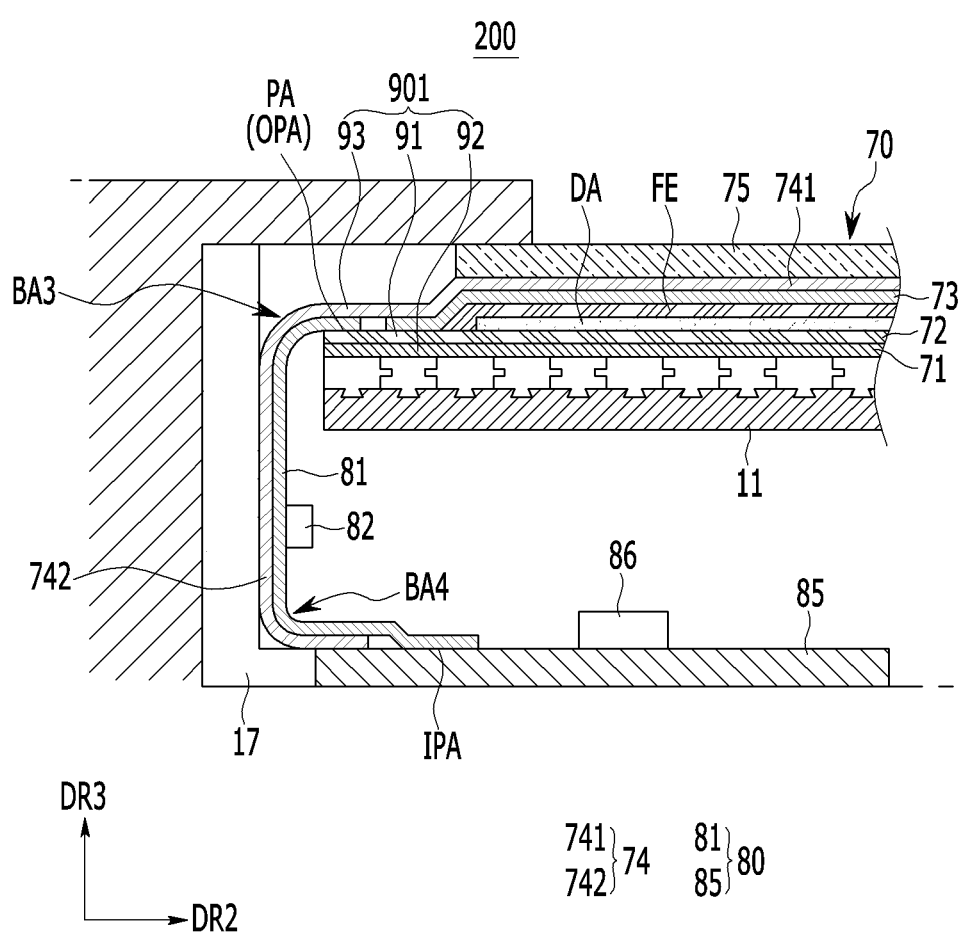
FIG. 8 illustrates a partial cross-sectional view of an expandable display device according to an embodiment.
Figure 9:
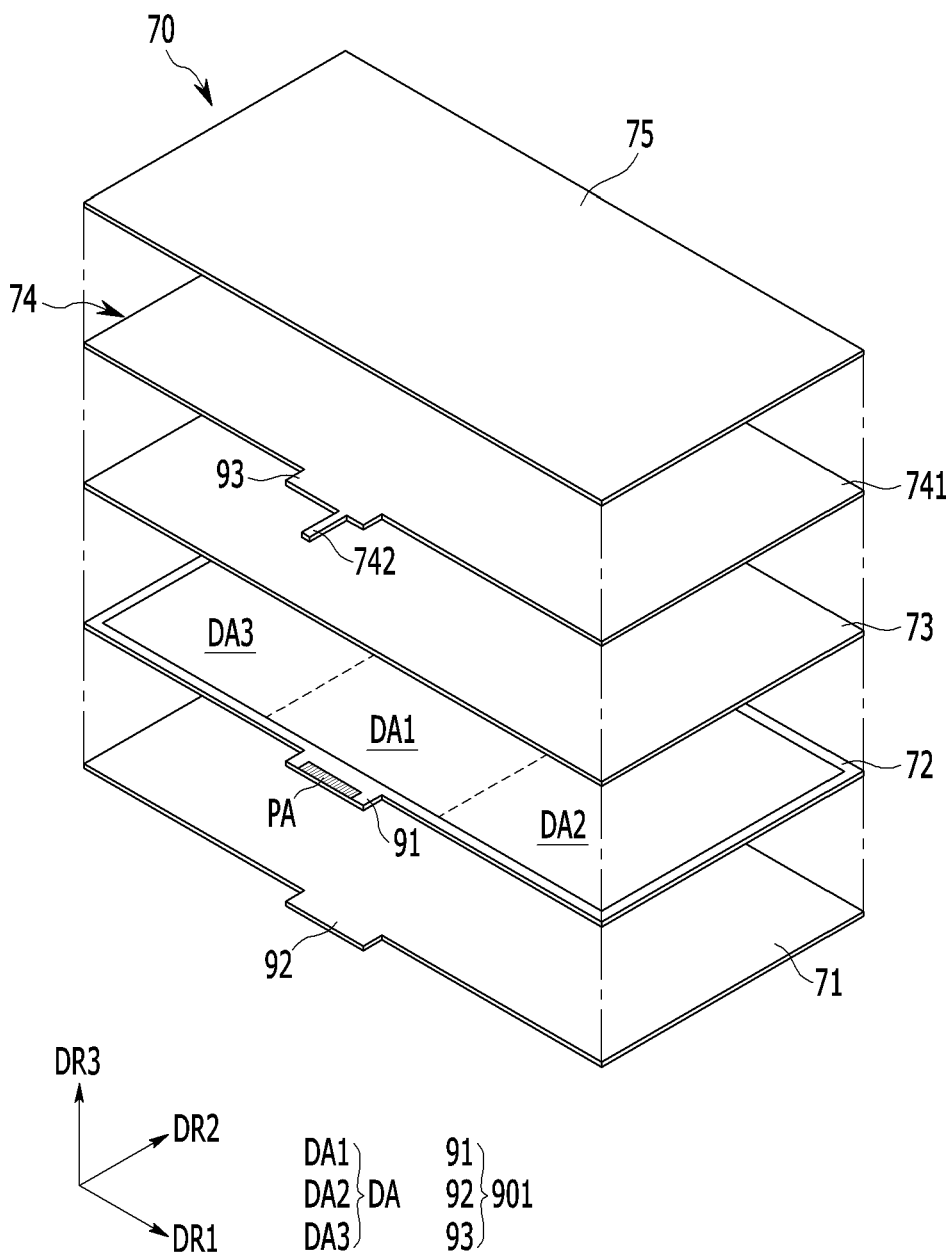
FIG. 9 illustrates an exploded perspective view of a flexible display panel of an expandable display device according to an embodiment.

FIG. 8 illustrates an enlarged partial view of an expandable display device according to an embodiment, and FIG. 9 illustrates an exploded perspective view of a flexible display panel of an expandable display device according to an embodiment.

Referring to FIG. 8 and FIG. 9, in an expandable display device 200, an expansion portion 901 does not include the bent portion. That is, an embodiment is the same as an embodiment in that the expansion portion 901 is formed to have a structure in which the first expansion portion 91, the second expansion portion 92, and the third expansion portion 93 are stacked, and the first expansion portion 91 includes the pad portion (PA), but the expansion portion 901 is positioned parallel to the fixed display unit DA1.

The flexible circuit board 81 is connected to the pad portion (PA) of the first expansion portion 91 at the output pad portion (OPA), and it is connected to the printed circuit board 85 at the input pad portion (IPA). The touch contact portion 742 overlaps the flexible circuit board 81 at the outside of the flexible circuit board 81. The flexible circuit board 81 and the touch contact portion 742 include a third bent portion BA3 and a fourth bent portion BA4.

The third bent portion BA3 and the fourth bent portion BA4 may be respectively bent at an angle of about 90°. The third bent portion BA3 may be positioned close to the output pad portion (OPA), and the fourth bent portion BA4 may be positioned close to the input pad portion (IPA). The driving integrated circuit 82 may be positioned between the third bent portion BA3 and the fourth bent portion BA4. The flexible circuit board 81 and the touch contact portion 742 are formed to have an entire ⊏ shape by the third bent portion BA3 and the fourth bent portion BA4.

The expandable display device 200 may have the same or similar features discussed above except for the expansion portion 901, the flexible circuit board 81, and the touch contact portion 742.

Figure 10:
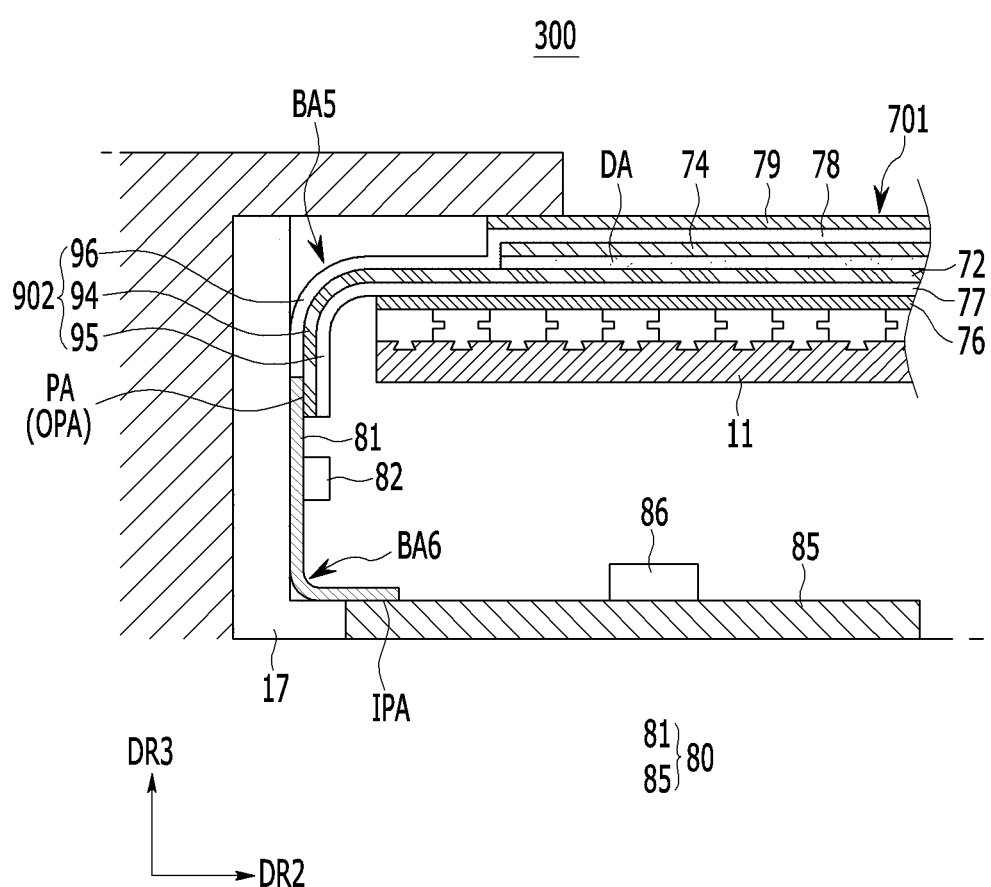
FIG. 10 illustrates a partial cross-sectional view of an expandable display device according to an embodiment.
Figure 11:
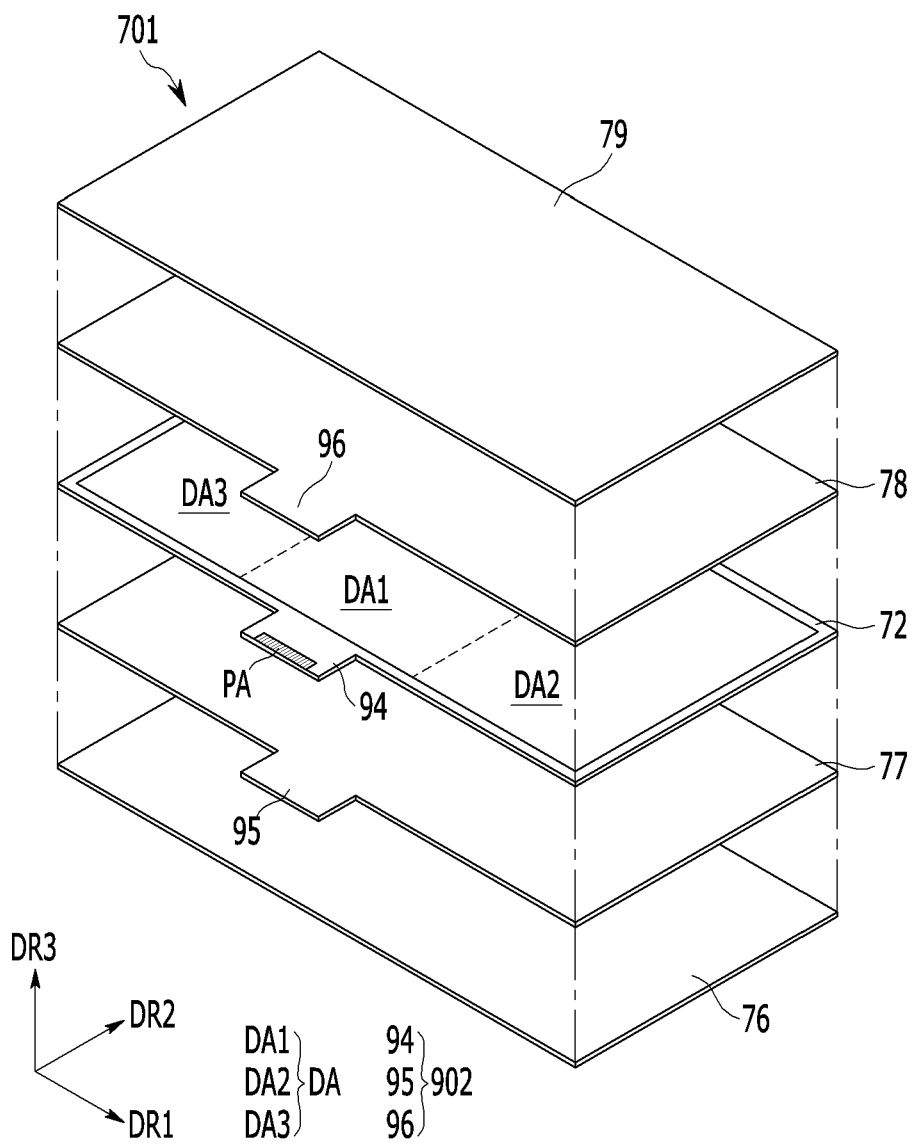
FIG. 11 illustrates an exploded perspective view of a flexible display panel of an expandable display device according to an embodiment.
Figure 12A:
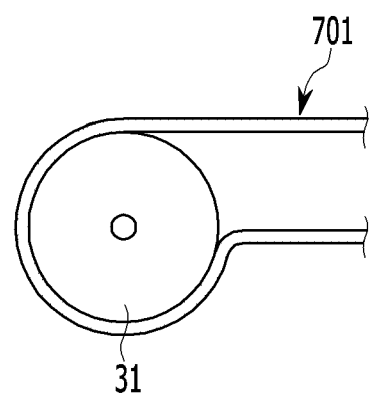
FIGS. 12A and 12B illustrate a partial cross-sectional view of a second roller and a flexible display panel of an expandable display device according to an embodiment.
Figure 12B:
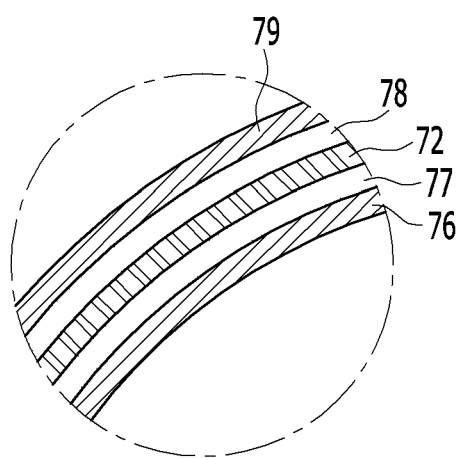

FIG. 10 illustrates a partially enlarged view of an expandable display device according to an embodiment, and FIG. 11 illustrates an exploded perspective view of a flexible display panel of an expandable display device according to an embodiment. FIGS. 12A and 12B illustrate a partially enlarged view of a second roller and a flexible display panel of an expandable display device according to an embodiment.

Referring to FIG. 10 to FIG. 12B, in an expandable display device 300, a flexible display panel 701 may include a first surface enhancing layer 76, a first elastomer layer 77, the flexible substrate 72, a second elastomer layer 78, and a second surface enhancing layer 79. The display unit (DA) is positioned on the flexible substrate 72, and includes the fixed display unit DA1, the first variable display unit DA2, and the second variable display unit DA3.

The touch sensor portion 74 may not include a separate substrate, but may include a plurality of sensing electrodes positioned on the flexible substrate 72 or the thin film encapsulation layer (not shown). The sensing electrodes are electrically connected to touch pad electrodes (not shown) formed at the pad portion (PA) through wires.

Since the first elastomer layer 77 and the second elastomer layer 78 have an elastic property, their restoring forces are excellent. Accordingly, the flexible display panel 701 including the first elastomer layer 77 and the second elastomer layer 78 is easily spread and bent, and even though the reduction mode or the expansion mode is maintained for a long time, the flexible display panel 701 is not deformed.

However, since the first elastomer layer 77 and the second elastomer layer 78 are sticky, the first surface enhancing layer 76 and the second surface enhancing layer 79 should respectively cover the first elastomer layer 77 and the second elastomer layer 78 so that their sticky surfaces may not be exposed outside. The first surface enhancing layer 76 and the second surface enhancing layer 79 may be formed with a flexible polymer film, and may include at least one of an anti-fingerprint coating layer, an antistatic layer, and a hard coating layer.

If there is no first surface enhancing layer 76, the first elastomer layer 77 sticks to the first roller and the second roller such that a smooth rolling operation is not performed, thus damage such as crack of the thin film encapsulation layer may occur. The first surface enhancing layer 76 contact the first roller 21 (refer to FIG. 4) and the second roller 31 so that friction force may be reduced and a smooth rolling operation may be performed. The second surface enhancing layer 79 provides a function such as the window.

The flexible display panel 701 includes an expansion portion 902 positioned at the outside of the fixed display unit DA1. The expansion portion 902 may include multiple layers, and includes the pad portion (PA). Specifically, the expansion portion 902 may include a fourth expansion portion 94 formed at the flexible substrate 72, a fifth expansion portion 95 formed at the first elastomer layer 77, and a sixth expansion portion 96 formed at the second elastomer layer 78.

The pad portion (PA) is positioned at an edge of the fourth expansion portion 94. The plurality of pad electrodes connected to the signal lines of the display unit (DA) and a plurality of touch pad electrodes connected to the touch sensor portion 74 are positioned at the pad portion (PA). The fifth expansion portion 95 and the sixth expansion portion 96 overlap with the fourth expansion portion 94 therebetween, and they protect the fourth expansion portion 94.

The expansion portion 902 of the flexible display panel 701 includes a fifth bent portion BA5. The fifth bent portion BA5 may be positioned between the fixed display unit DA1 and the pad portion (PA), and may be bent at an angle of about 90°. The pad portion (PA) is positioned parallel to the third direction DR3 at a lowermost portion of the flexible substrate 72 by the fifth bent portion BA5.

The flexible circuit board 81 includes a sixth bent portion BA6. The sixth bent portion BA6 may be bent at an angle of about 90°. With the sixth bent portion BA6 therebetween, some of the flexible circuit board 81 positioned at the output pad portion (OPA) is positioned parallel to the third direction DR3, and some of the flexible circuit board 81 positioned at the input pad portion (IPA) is positioned parallel to the second direction DR2. In FIG. 10, numeral 17 designates a buffering sheet for protecting the flexible circuit board 81.

In the expandable display device 300, the expansion portion 902 includes the fifth bent portion BA5 and the pad portion (PA), and the flexible circuit board 81 includes the sixth bent portion BA6. Accordingly, the flexible display panel 701, the flexible circuit board 81, and the printed circuit board 85 are formed to have an entire ⊏ shape, and the driving module portion 80 is positioned below the fixed display unit DA1 which does not move.

The expandable display device 300 may have the same or similar features discussed above except for the stacked structure of the flexible display panel 701 and the expansion portion 902.

Figure 13:
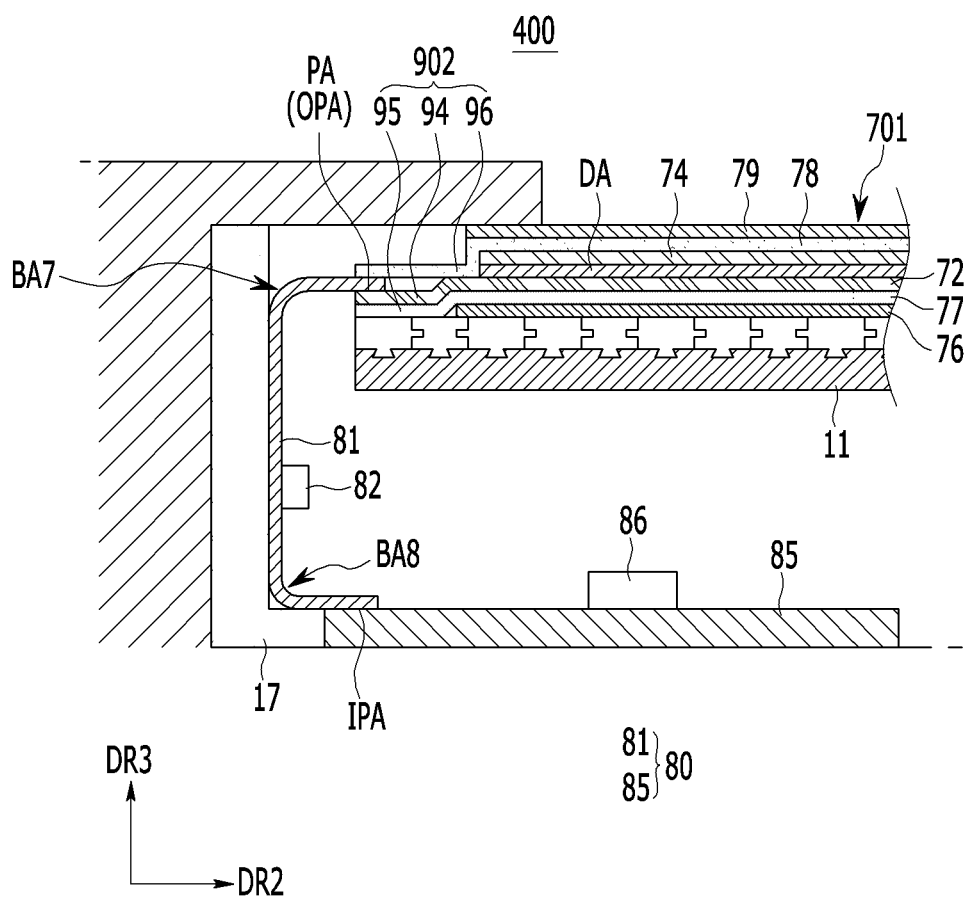
FIG. 13 illustrates a partial cross-sectional view of an expandable display device according to an embodiment.
Figure 14:
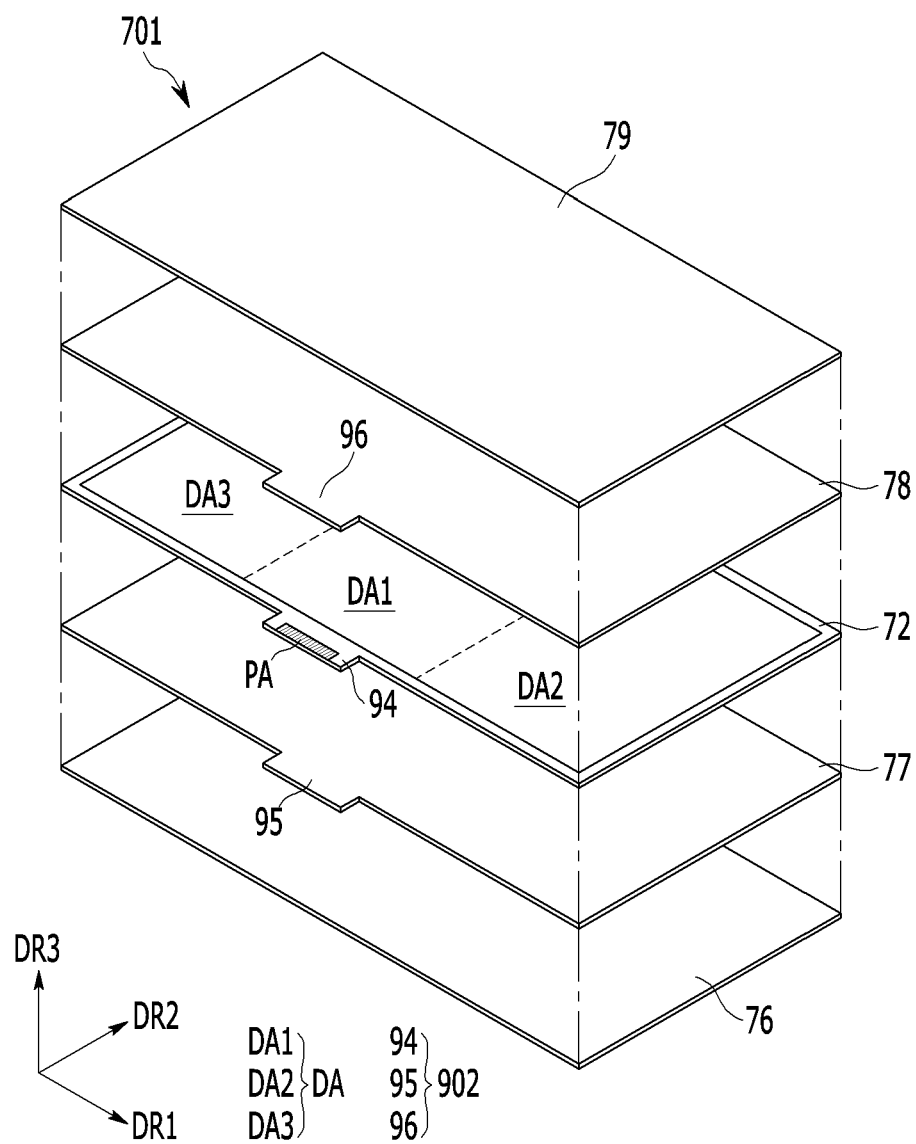
FIG. 14 illustrates an exploded perspective view of a flexible display panel of an expandable display device according to an embodiment.

FIG. 13 illustrates a partially enlarged view of an expandable display device according to an embodiment, and FIG. 14 illustrates an exploded perspective view of a flexible display panel of an expandable display device according to an embodiment.

Referring to FIG. 13 and FIG. 14, in an expandable display device 400, the expansion portion 902 does not include the bent portion. That is, an embodiment is the same as an embodiment in that the expansion portion 902 is formed to have a structure in which the fourth expansion portion 94, the fifth expansion portion 95, and the sixth expansion portion 96 are stacked, and the fourth expansion portion 94 includes the pad portion (PA), but the expansion portion 902 is positioned parallel to the fixed display unit DA1.

The flexible circuit board 81 includes a seventh bent portion BA7 and an eighth bent portion BA8. The seventh bent portion BA7 and the eighth bent portion BA8 may be bent at an angle of about 90°. The seventh bent portion BA7 may be adjacent to the output pad portion (OPA), and the eighth bent portion BA8 may be adjacent to the input pad portion (IPA). The driving integrated circuit 82 may be positioned between the seventh bent portion BA7 and the eighth bent portion BA8.

The expandable display device 400 may have the same or similar features discussed above except for the expansion portion 902 and the flexible circuit board 81.

Figure 15:
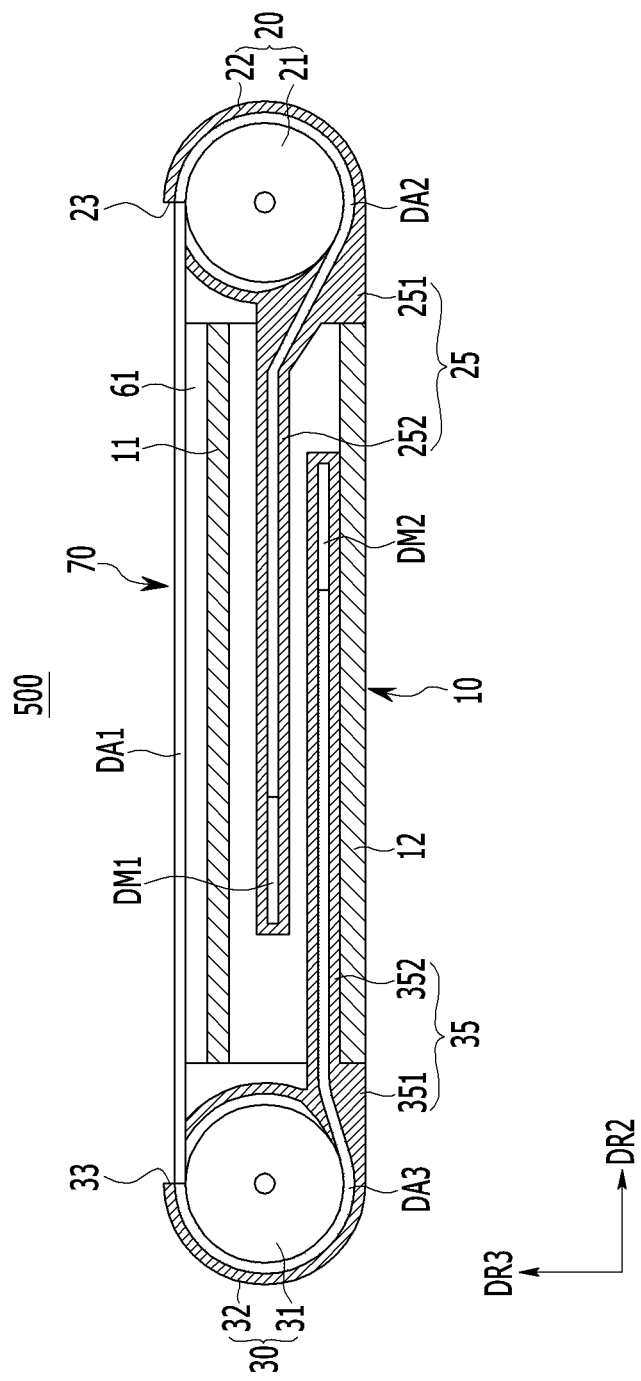
FIG. 15 illustrates a cross-sectional view of a reduction mode of an expandable display device according to an embodiment.

FIG. 15 illustrates a cross-sectional view of a reduction mode of an expandable display device according to an embodiment.

Referring to FIG. 15, in an expandable display device 500 of an embodiment, the first guiding portion 25 includes a first inclined guiding portion 251 connected to the first roller housing 22, and a first flat guiding portion 252 connected to the first inclined guiding portion 251. The first inclined guiding portion 251 allows the flexible display panel 70 to be smoothly slid by the flexible display panel 70 being gently bent.

The second guiding portion 35 includes a second inclined guiding portion 351 connected to the second roller housing 32, and a second flat guiding portion 352 connected to the second inclined guiding portion 351. The second inclined guiding portion 352 allows the flexible display panel 70 to be smoothly slid by the flexible display panel 70 being gently bent.

The expandable display device 500 may have the same or similar features discussed above except for the first guiding portion 25 and the second guiding portion 35.

Figure 16:
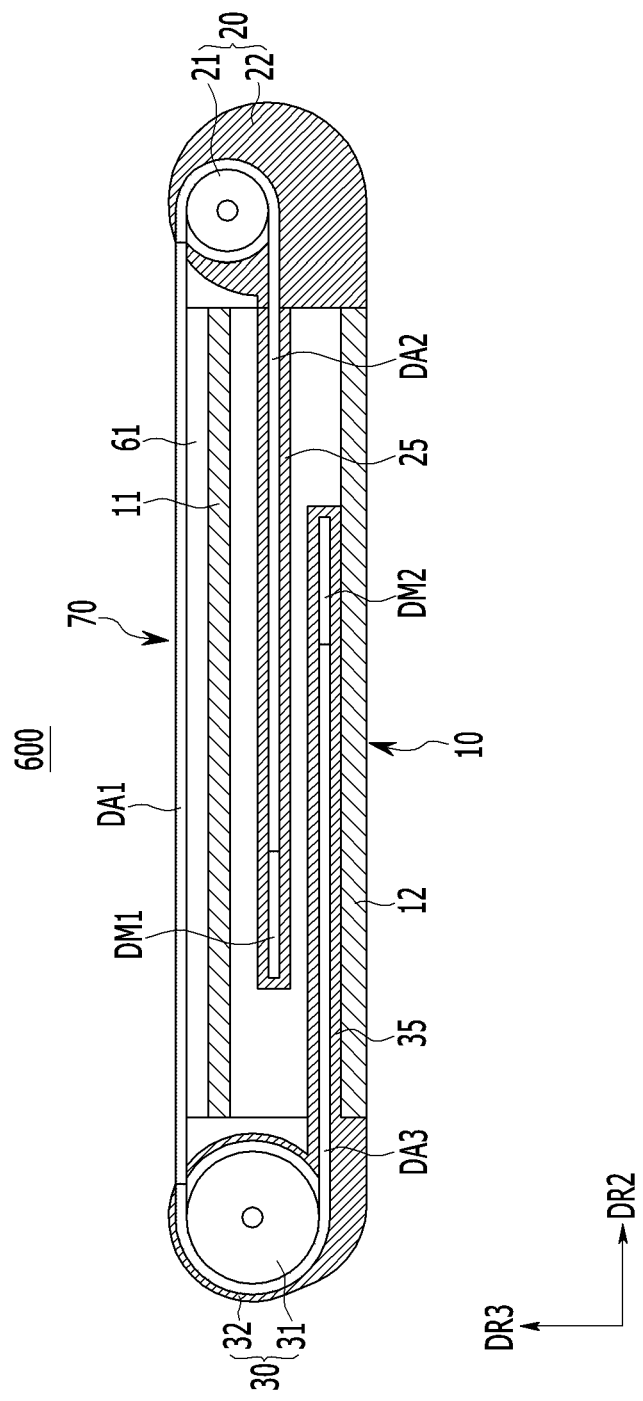
FIG. 16 illustrates a cross-sectional view of a reduction mode of an expandable display device according to an embodiment.

FIG. 16 illustrates a cross-sectional view of a reduction mode of an expandable display device according to an embodiment.

Referring to FIG. 16, in an expandable display device 600 of an embodiment, the first roller 21 and the second roller 31 have different diameters. In FIG. 16, although the case that the diameter of the first roller 21 is smaller than that of the second roller 31 is illustrated, the opposite case is also allowable. Alternatively, the first roller housing 22 and the second roller housing 32 may have the same diameter (the same exterior diameter).

The receiving space of the first guiding portion 25 may communicate with a lowermost portion of the first roller 21, and the receiving space of the second guiding portion 35 may communicate with a lowermost portion of the second roller 31.

The expandable display device 600 the same or similar features discussed above except for the diameter difference between the first roller 21 and the second roller 31.

Figure 17:
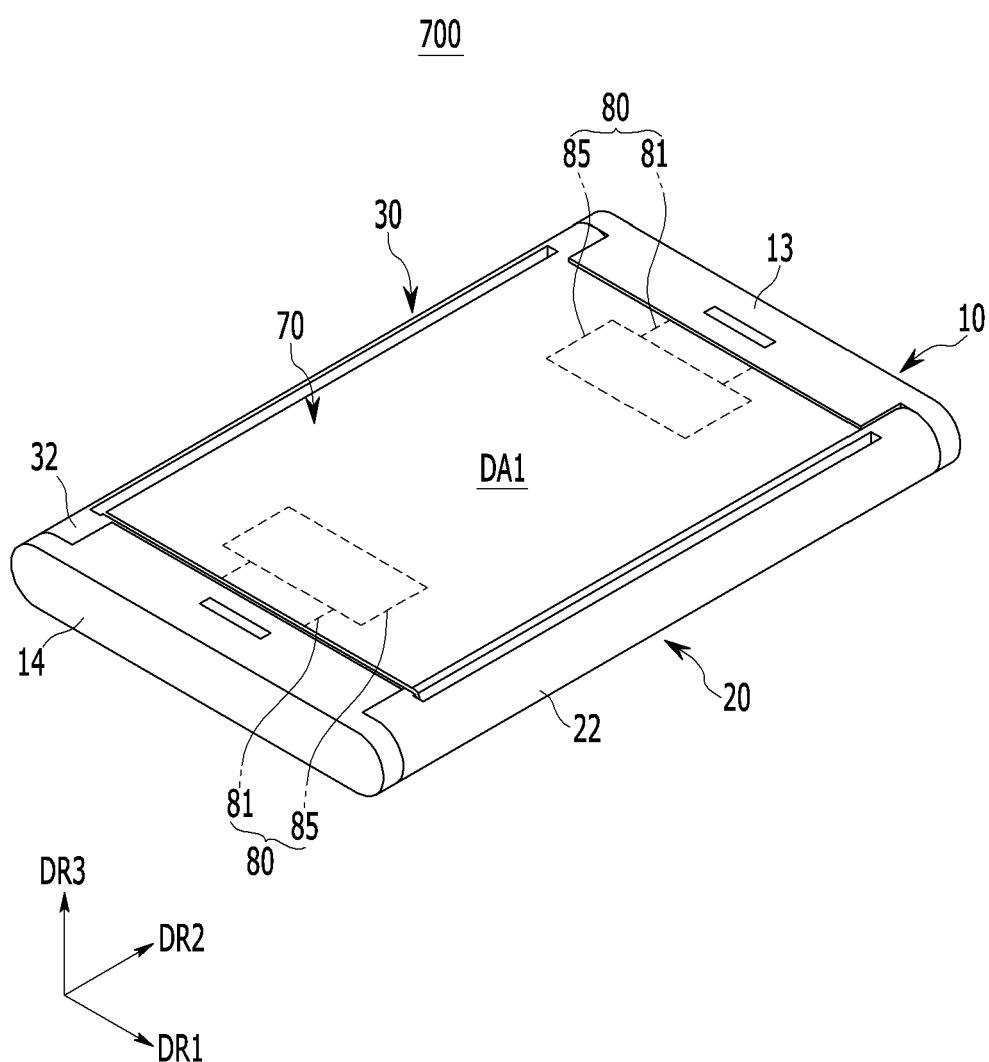
FIG. 17 illustrates a perspective view of a reduction mode of an expandable display device according to an embodiment.

Although it has been described that the aforementioned expandable display devices (100, 200, 300, 400, 500, and 600) include a single driving module portion 80, the expandable display devices may include two driving module portions. FIG. 17 illustrates a perspective view of a reduction mode of an expandable display device according to an embodiment.

Referring to FIG. 17, an expandable display device 700 includes two driving module portions 80 and two expansion portions (not shown). The expandable display device 700 may have the same or similar features discussed above except for the inclusion of two driving module portions 80.

Figure 18:
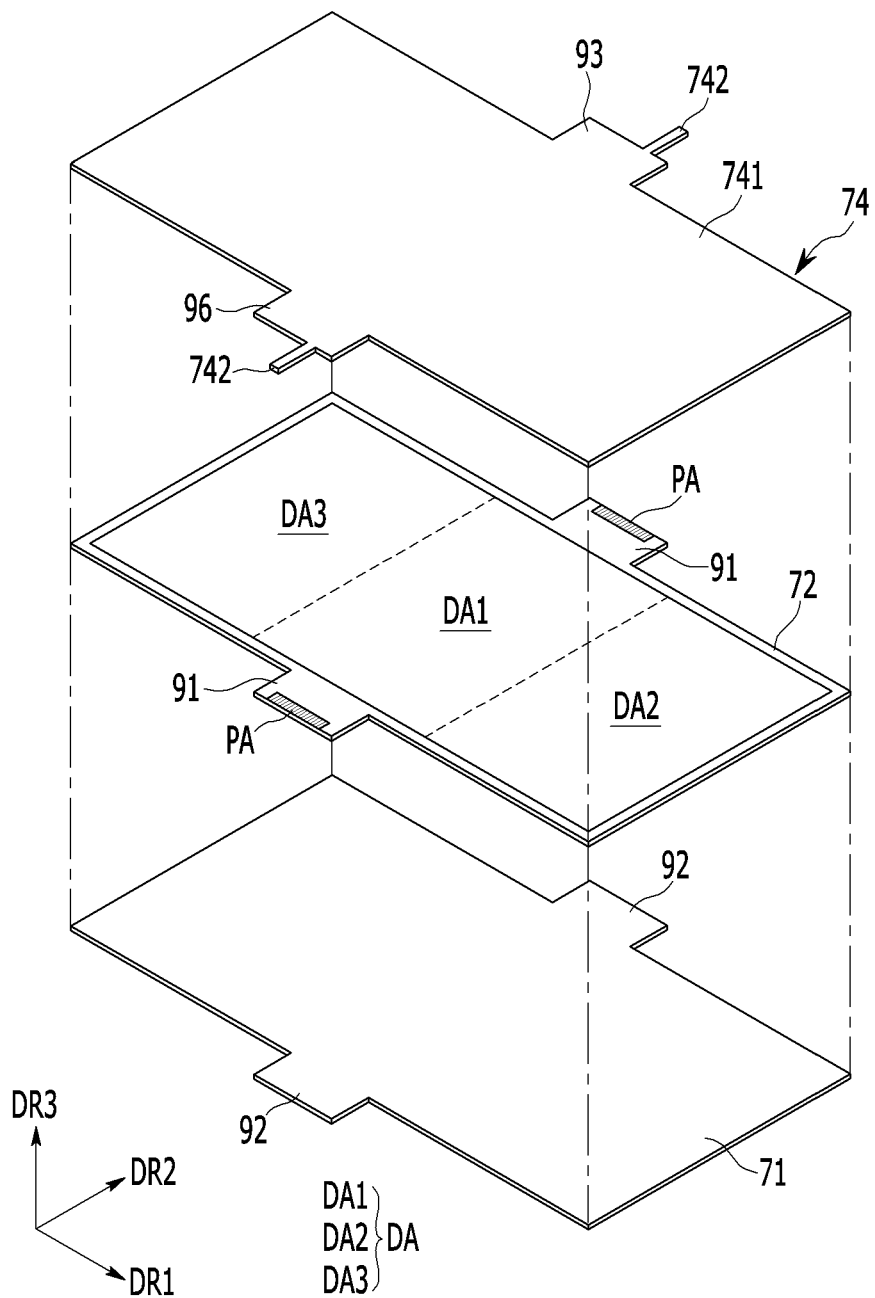
FIG. 18 illustrates an exploded perspective view of some elements of the flexible display panel of the expandable display device shown in FIG. 17 according to an embodiment.
Figure 19:
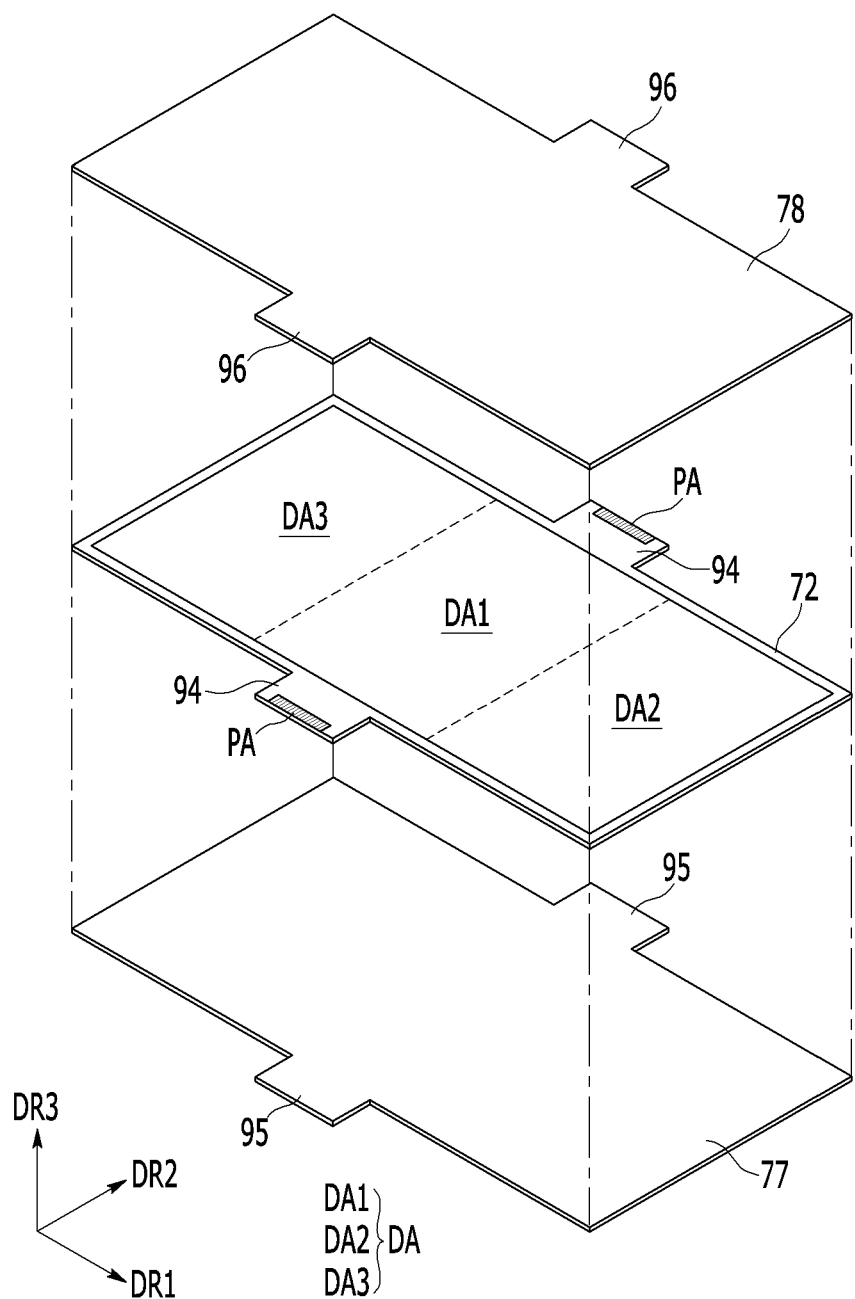
FIG. 19 illustrates an exploded perspective view of some elements of the flexible display panel of the expandable display device shown in FIG. 17 according to an embodiment.

FIG. 18 and FIG. 19 illustrate exploded perspective views of some elements of the flexible display panel of the expandable display device shown in FIG. 17 according to one or more embodiments.

Referring to FIG. 18, the flexible display panel may include the first passivation layer 71, the flexible substrate 72, the second passivation layer (not shown), the touch sensor portion 74, and the window (not shown).

The flexible substrate 72 includes a pair of first expansion portions 91 respectively positioned at outer upper and lower portions of the fixed display unit DA1. The first expansion portions 91 face each other in the second direction DR2. The first passivation layer 71 includes a pair of second expansion portions 92 overlapping the pair of first expansion portions 91, and the touch sensor portion 74 includes a pair of third expansion portions 93 overlapping the pair of first expansion portions 91.

Referring to FIG. 19, the flexible display panel may include the first surface enhancing layer (not shown), the first elastomer layer 77, the flexible substrate 72, the second elastomer layer 78, and the second surface enhancing layer (not shown).

The flexible substrate 72 includes a pair of fourth expansion portions 94 respectively positioned at outer upper and lower portions of the fixed display unit DA1. The fourth expansion portions 94 face each other in the second direction DR2. The first elastomer layer 77 includes a pair of fifth expansion portions 95 overlapping the pair of fourth expansion portions 94, and the second elastomer layer 78 includes a pair of sixth expansion portions 96 overlapping the pair of fourth expansion portions 94.

Referring to FIG. 17 to FIG. 19, two flexible circuit boards 81 are respectively connected to a pair of pad portions (PA) formed at the pair of first expansion portions 91 or the pair of fourth expansion portions 94. The display unit (DA) is divided into a first region and a second region, and two driving module portion 80 respectively apply electrical signals for displaying an image to signal lines of the first region and signal lines of the second region.

While example embodiments have been described, practical embodiments are not limited to the example embodiments. Embodiments are intended to cover various modifications and equivalent arrangements within the spirit and scope defined by the appended claims.

What is claimed is:

1. A display device comprising:
a housing including a support plate;
a first roller portion and a second roller portion positioned at opposite sides of the support plate, and to be respectively connected to the housing by a first sliding portion and a second sliding portion for sliding relative to the support plate;
a flexible display panel including a fixed display unit positioned and fixed on the support plate, a first variable display unit and a second variable display unit respectively connected to the first roller portion and the second roller portion and including variable exposure areas, and an expansion portion positioned beyond the fixed display unit, including multiple layers, and including a pad portion; and
a flexible circuit board electrically connected to the pad portion and including at least one bent portion.

2. The display device of claim 1, wherein
the flexible display panel includes a flexible substrate, a first passivation layer positioned below the flexible substrate, and a touch sensor portion positioned on the flexible substrate, and
the flexible circuit board is connected to a printed circuit board (PCB) overlapping the fixed display unit.

3. The display device of claim 2, wherein
the expansion portion includes a first expansion portion formed at the flexible substrate and including the pad portion, a second expansion portion formed at the first passivation layer, and a third expansion portion formed at the touch sensor portion.

4. The display device of claim 3, wherein
the expansion portion includes a first bent portion, and
the flexible circuit board includes a second bent portion.

5. The display device of claim 4, wherein
a touch contact portion of the touch sensor portion is positioned between the third expansion portion and the printed circuit board (PCB), and
the touch contact portion overlaps the flexible circuit board, and includes the second bent portion.

6. The display device of claim 3, wherein
the expansion portion is parallel to the fixed display unit, and
the flexible circuit board includes a third bent portion and a fourth bent portion.

7. The display device of claim 6, wherein
a touch contact portion is positioned between the third expansion portion and the printed circuit board (PCB), and
the touch contact portion overlaps the flexible circuit board, and includes the third bent portion and the fourth bent portion.

8. The display device of claim 1, wherein
the flexible display panel includes a flexible substrate, a first elastomer layer positioned below the flexible substrate, and a second elastomer layer positioned on the flexible substrate, and
the flexible circuit board is connected to a printed circuit board (PCB) overlapping the fixed display unit.

9. The display device of claim 8, wherein
the flexible display panel includes a first surface enhancing layer positioned below the first elastomer layer and a second surface enhancing layer positioned on the second elastomer layer.

10. The display device of claim 8, wherein
the expansion portion includes multiple layers of a fourth expansion portion formed at the flexible substrate and including the pad portion, a fifth expansion portion formed at the first elastomer layer, and a sixth expansion portion formed at the second elastomer layer.

11. The display device of claim 9, wherein
the expansion portion includes a fifth bent portion, and
the flexible circuit board includes a sixth bent portion.

12. The display device of claim 9, wherein
the expansion portion is positioned to be parallel to the fixed display unit, and
the flexible circuit board includes a seventh bent portion and an eighth bent portion.

13. The display device of claim 1, further comprising
a rail portion configured to support the flexible display panel,
wherein the rail portion includes a fixed rail portion fixed to the support plate, a first moving rail portion connected to the first roller portion and engaged with the fixed rail portion, and a second moving rail portion connected to the second roller portion and engaged with the fixed rail portion.

14. The display device of claim 13, wherein
the first roller portion includes a first roller housing provided with a first slit, and a first roller rotatably installed at the first roller housing, and
the second roller portion includes a second roller housing provided with a second slit, and a second roller rotatably installed at the second roller housing.

15. The display device of claim 14, wherein
the first moving rail portion is fixed to the first roller housing,
the second moving rail portion is fixed to the second roller housing, and
the first moving rail portion and the second moving rail portion overlap the support plate in a reduction mode, and are expanded from the support plate to the outside thereof in an expansion mode.

16. The display device of claim 15, wherein
a length of the first moving rail portion is longer than a maximum sliding distance of the first roller portion, and
a length of the second moving rail portion is longer than a maximum sliding distance of the second roller portion.

17. The display device of claim 14, wherein
the first sliding portion includes a first driving slider fixed to one end of the first roller housing, a first following slider fixed to another end of the first roller housing, and a first actuator connected to the first driving slider, and
the second sliding portion includes a second driving slider fixed to one end of the second roller housing, a second following slider fixed to another end of the second roller housing, and a second actuator connected to the second driving slider.

18. The display device of claim 17, wherein
the first driving slider is positioned at the outside of the second following slider with a first guiding wall formed at the housing therebetween, and
the second driving slider is positioned at the outside of the first following slider with a second guiding wall formed at the housing therebetween.

19. The display device of claim 14, wherein
the flexible display panel includes a first dummy portion positioned at the outside of the first variable display unit, and a second dummy portion positioned at the outside of the second variable display unit, and
in an expansion mode, the first dummy portion and the second dummy portion respectively contact the first roller and the second roller.

20. The expandable display device of claim 19, wherein
a first guiding portion is connected to the first roller housing below the support plate to receive the first variable display unit and the first dummy portion in a reduction mode, and
a second guiding portion is connected to the second roller housing below the support plate to receive the second variable display unit and the second dummy portion in a reduction mode.

21. A display device comprising:
a support plate;
a first display unit, which overlaps the support plate;
a second display unit, wherein a first end of the second display unit is connected through a second end of the second display unit to the first display unit and is configured to move relative to the support plate;
a third display unit, which is connected through the first display unit to the second display unit, wherein a first end of the third display is connected through a second end of the third display unit to the first display unit and is configured to move relative to the support plate;
a pad, which comprises a pad electrode, wherein the pad electrode is electrically connected to the first display unit;
a first circuit board, which is electrically connected to the pad and is positioned between the second display unit and the third display unit in a plan view of the display device.

22. The display device of claim 21,
wherein the first circuit board is connected to a second circuit board,
wherein the second circuit board overlaps the first display unit.

* * * * *